United States Patent [19]

Shikata

[11] Patent Number: 5,624,853
[45] Date of Patent: Apr. 29, 1997

[54] METHOD FOR FORMING HETEROJUNCTION BIPOLAR TRANSISTORS

[75] Inventor: Shinichi Shikata, Itami, Japan

[73] Assignee: Sumitomo Electric Industries, Ltd., Osaka, Japan

[21] Appl. No.: 417,781

[22] Filed: Apr. 6, 1995

Related U.S. Application Data

[62] Division of Ser. No. 280,805, Jul. 26, 1994, Pat. No. 5,536,952, which is a continuation of Ser. No. 36,257, Mar. 24, 1993, abandoned.

[30] Foreign Application Priority Data

| Mar. 24, 1992 | [JP] | Japan | 4-066107 |
| Mar. 24, 1992 | [JP] | Japan | 4-066108 |
| Apr. 8, 1992 | [JP] | Japan | 4-087260 |
| Apr. 8, 1992 | [JP] | Japan | 4-087268 |

[51] Int. Cl.$^6$ .................................................. H01L 21/265
[52] U.S. Cl. .......................... 438/105; 438/317; 438/931; 438/932
[58] Field of Search .................... 148/DIG. 72, DIG. 10, 148/DIG. 11, DIG. 148; 437/31, 126, 100

[56] References Cited

U.S. PATENT DOCUMENTS

| 4,097,888 | 6/1978 | Russell . | |
| 4,945,394 | 7/1990 | Palmour et al. . | |
| 4,985,742 | 1/1991 | Pankove | 357/34 |
| 5,006,914 | 4/1991 | Beetz, Jr. . | |
| 5,043,773 | 8/1991 | Precht et al. . | |
| 5,117,267 | 5/1992 | Kimoto et al. . | |
| 5,132,749 | 7/1992 | Nishibayashi et al. | 357/15 |

(List continued on next page.)

FOREIGN PATENT DOCUMENTS

| 125943 | 11/1984 | European Pat. Off. . |
| 282054 | 9/1988 | European Pat. Off. . |
| 379359 | 7/1990 | European Pat. Off. . |
| 62-159463 | 7/1987 | Japan . |
| 62-160760 | 7/1987 | Japan . |
| 62-216364 | 9/1987 | Japan . |
| 62-265762 | 11/1987 | Japan . |
| 6455862 | 2/1989 | Japan . |
| 1-55862 | 3/1989 | Japan . |
| 01143261 | 6/1989 | Japan . |
| 3-97275 | 4/1991 | Japan . |
| 5-29331 | 2/1993 | Japan . |

OTHER PUBLICATIONS

Hayama et al, "Fully Self–Aligned AlGaAs/GaAs HBT With AlGaGAs Passivation Layer," The Institute of Electronics and Information, Technical Report ED–89–147 (1989), pp. 68–69.

Morizuka et al, "AlGaAs/GaAs HBT's Fabricated by a Self–Alignment Technology Using Polyimide for Electrode Separation," IEEE Electron Device Letters, EDL–9, 598 (1988), pp. 268–270.

Han–Tzong Yuan et al, "The Development of Heterojunction Integrated Injection Logic," IEEE Transations on Electron Devices, vol. 36, No. 10, Oct. 1989, pp. 2083–2092.

K. Nagata et al, "Self–aligned AlGaAs/GaAs HBT With Low Emitter Resistance Utilizing InGaAs Cap Layer," IEEE Trans. Electron Devices, vol. ED–35, Jan. 1988, pp. 2–7.

Primary Examiner—John Niebling
Assistant Examiner—Long Pham
Attorney, Agent, or Firm—Cushman Darby & Cushman, IP Group of Pillsbury Madison & Sutro, LLP

[57] ABSTRACT

A pnp transistor is formed having a heterojunction of p-type diamond (or $BP_xN_{1-x}$, 6HSiC) and n-type SiC (3CSiC). The transistor is formed such that a $p^+$-SiC (3CSiC) layer, a p-SiC (3CSiC) layer, an $n^+$-SiC (3CSiC) layer, a p-diamond (or $BP_xN_{1-x}$, 6HSiC) layer, and a $p^+$-diamond (or $BP_xN_{1-x}$, 6HSiC) layer are on a substrate, and a collector electrode, a base electrode. An emitter electrode is formed on and electrically connected to the $p^+$-Sic layer, the $n^+$-SiC layer, and the layer, respectively. This method produces a semiconductor device having a high resistance to various environmental conditions.

8 Claims, 20 Drawing Sheets

U.S. PATENT DOCUMENTS

| | | | |
|---|---|---|---|
| 5,144,398 | 9/1992 | Morishita . | |
| 5,164,810 | 11/1992 | Doll et al. . | |
| 5,179,070 | 6/1993 | Harada et al. . | |
| 5,247,192 | 9/1993 | Nii . | |
| 5,266,819 | 11/1993 | Chang et al. | 257/198 |
| 5,272,096 | 12/1993 | De Frésart et al. | 437/31 |
| 5,285,089 | 2/1994 | Das | 257/197 |
| 5,326,992 | 7/1994 | Yoder | 257/77 |
| 5,350,699 | 9/1994 | Nii | 437/31 |
| 5,378,921 | 1/1995 | Ueda | 257/574 |
| 5,389,554 | 2/1995 | Liu et al. | 148/DIG. 72 |
| 5,442,199 | 8/1995 | Saito et al. | 257/77 |
| 5,536,952 | 7/1996 | Shikata | 257/77 |

METHOD FOR FORMING HETEROJUNCTION BIPOLAR TRANSISTORS

This is a division of application Ser. No. 08/280,805, filed Jul. 26, 1994, now U.S. Pat. No. 5,536,952 which is a continuation of Ser. No. 08/036,257, filed Mar. 24, 1993, now abandoned.

BACKGROUND OF THE INVENTION

1. Field of the Invention

The present invention relates to a method for forming semiconductor device having a high environmental resistance enabling it to operate under various operating conditions.

2. Related Background Art

Since the invention of a transistor in 1947, ICs and LSIs are derived from transistors and semiconductor techniques have been remarkably developed. In particular, a silicon semiconductor technique has been established, and various circuits are formed into ICs which are used in a variety of applications. However, elements have operational limitations caused by physical properties of silicon. In some applications, semiconductors other than silicon have been used.

For example, in the field of communications having a very high frequency such as a microwave as in satellite communication, the carrier mobility of silicon is an obstacle against the development of elements. A countermeasure against this problem is a method of precisely micropatterning elements, but the micropatterned element in turn poses another problem regarding allowable power characteristics including heat resistance. For this reason, GaAs having a high carrier mobility has been used in place of silicon for the above applications. Similar problems are posed by high-speed digital circuits (e.g., a supercomputer). For this reason digital ICs using GaAs as a semiconductor material have been developed and are often used in practice.

When silicon is used to form a bipolar transistor, a large current amplification factor, i.e., a high current gain cannot be achieved by a simple pnp layer structure. The collector breakdown voltage cannot be increased by this structure, either. For this reason, a specific structure and circuit arrangement have been implemented for obtaining a larger current amplification factor and a higher collector breakdown voltage according to the state-of-the-art techniques.

A material having a large band gap is preferably used in the above applications. A heterojunction bipolar transistor is assumed as one of the devices which can replace conventional silicon bipolar semiconductor devices. Examples of the heterojunction bipolar transistor are disclosed in Japanese Patent Laid-Open No. 62-216364, 62-265762, 62-160760, and 62-159463. These examples are transistors each utilizing a heterojunction formed between silicon and silicon carbide. However, since silicon is used as a material, drastic solutions to the problems on a low breakdown voltage and a low resistance to environment cannot be provided. Since materials such as diamond and silicon carbide have large band gaps among the currently available materials, good performance can be expected in the above applications if these materials are used. Extensive studies have been made to develop a better semiconductor material using these materials in applications which cannot be handled by the silicon semiconductor, as described in Japanese Patent Laid-Open No. 64-55862 filed by the present applicant.

SUMMARY OF THE INVENTION

It is the first object of the present invention to provide a method for forming a semiconductor device (a transistor and an IC using the transistor) wherein silicon carbide is used to form a collector region (first layer) and a base region (second layer), and a material having a larger band gap than that of silicon carbide of the base region is used to form an emitter region (third layer), so that a heterojunction is formed between the base and emitter regions, and the base and collector regions have a junction of the same material, i.e., silicon carbide. In this manner, only one heterojunction is formed to facilitate formation of a good semiconductor layer.

The first and second layers are made of silicon carbide layers having the same crystal structure to form a homojunction between the base and collector region, thereby further facilitating formation of a good semiconductor layer.

The material having a larger band gap than that of silicon carbide is diamond or $BP_xN_{1-x}$ ($0 \leq x \leq 1$) (wherein $BP_xN_{1-x}$ can form a good layer having a lattice constant almost equal to that of silicon carbide when $x \equiv 0.1$).

If the base and collector regions are made of cubic silicon carbide, hexagonal silicon carbide can be used for the emitter region as a material having a larger band gap than that of cubic silicon carbide.

Second, an SiC substrate is used as a substrate, and the collector, emitter, and base regions are sequentially formed on the SiC substrate, so that a substrate having a large area can be used to facilitate mass production of devices.

In particular, assume that a layer (third layer) using diamond or $BP_xN_{1-x}$ serves as the uppermost layer in the emitter region. In this case, even if the third layer does not have a uniform crystal structure on the entire surface of the substrate, the third layer may partially have a uniform crystal structure. This uniform crystal region can be used to arrange a device, thus providing an advantage in that diamond or BPN need not be formed on a large area. The third layer may have a polycrystalline structure because a polycrystalline layer can be more easily formed.

When cubic silicon carbide is used for the base and collector regions, and hexagonal silicon carbide is used for the emitter region, these semiconductor layers can be properly formed on the substrate because these layers and the substrate are made of the same material. In addition, either pnp or npn devices can be formed.

Since the bipolar transistor has a heterojunction made of a semiconductor having a large band gap, a large collector current can be obtained by a small base current in accordance with the potential barrier formed by this heterojunction.

The bipolar transistor has resistance to radiation and can be properly operated at very high temperatures. Since the band gap of the collector is large, the bipolar transistor has a high collector breakdown voltage. This allows formation of a good device as compared with a GaAs device.

According to a method of manufacturing a semiconductor device of the present invention, a semiconductor device which can properly operate can be manufactured.

When base and collector electrodes are self-aligned, the base resistance and the base and collector capacitances are reduced to obtain a high-performance device.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE PREFERRED EMBODIMENTS

Figure 1:
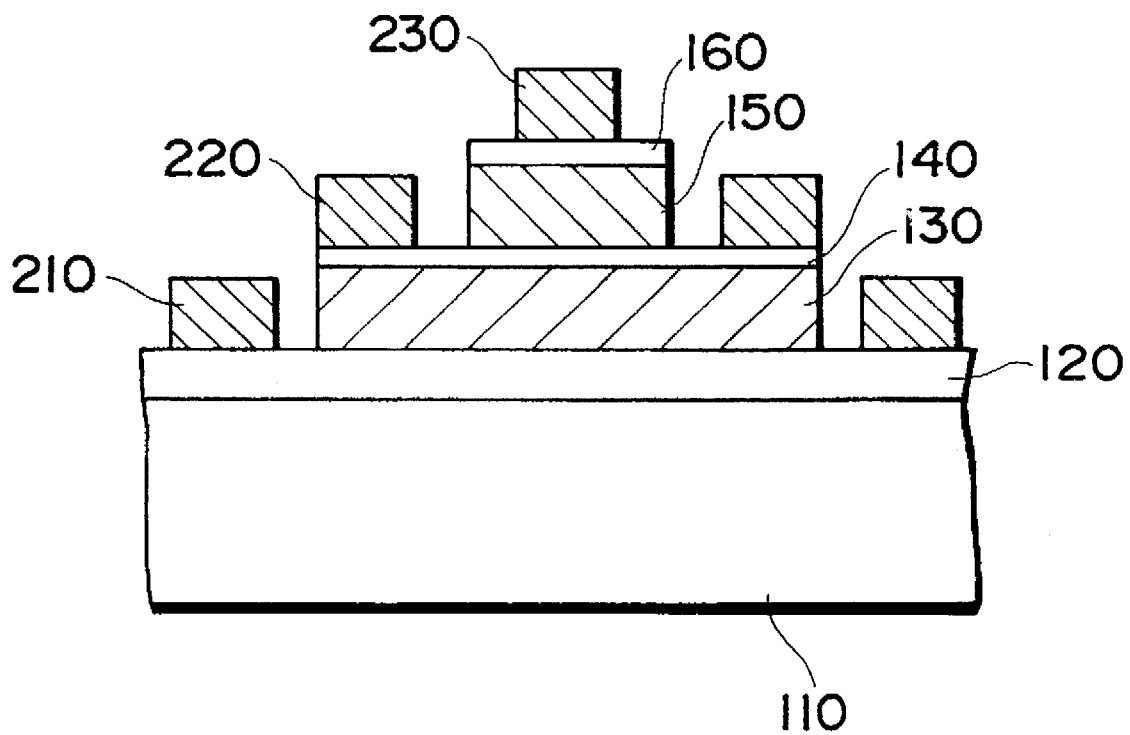
FIG. 1 is a sectional view showing the structure of the first embodiment.

Preferred embodiments of the present invention will be described with reference to the accompanying drawings. FIG. 1 shows the structure of a transistor according to an embodiment. In this transistor, a $p^+$-diamond layer 120, a p-diamond layer 130, an $n^+$-SiC layer 140, a p-SiC layer 150, and a $p^+$-SiC layer 160 are sequentially formed on a nondoped diamond substrate 110. An emitter electrode 210, a base electrode 220, and a collector electrode 230 are electrically connected to the $p^+$-diamond layer 120, the $n^+$-SiC layer 140, and the $p^+$-SiC layer 160, respectively. SiC is defined herein to have a cubic crystal structure (3C-SiC or β-SiC).

p, $p^+$, n, and $n^+$ represent p- and n-type semiconductor layers, and suffix "+" represent relatively high impurity concentrations, respectively.

This transistor is manufactured by the following steps.

Figure 2A:
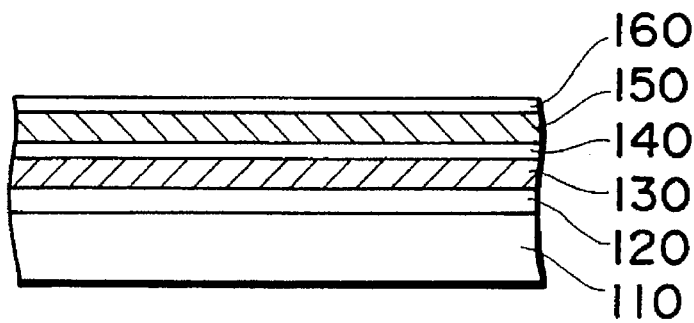
FIGS. 2A to 2D are sectional views for explaining the steps in manufacturing a transistor shown in FIG. 1.

The $p^+$-diamond layer 120 and the p-type diamond layer 130 are sequentially formed on the diamond substrate 110 by a microwave CVD method. At this time, the microwave had a frequency of 2.45 GHz and an output power of 400 W, and a source gas was a gas mixture of $CH_4/H_2$ at a ratio of 4:100. The growth conditions were a pressure of 500 Torr and a temperature of 600° to 900° C. In this case, $B_2H_6$ is mixed in the source gas to dope B (boron), and the content of B is changed to form the $p^+$-diamond layer 120 and the p-diamond layer 130. Thereafter, the $n^+$-SiC layer 140, the p-SiC layer 150, and the $p^+$-SiC layer 160 are sequentially formed by a low-pressure CVD method. At this time, the source gas was a gas mixture of $C_3H_8/SiHCl_2$ at a mixing ratio of 1:2. $H_2$ was used as a carrier gas. The growth conditions were a pressure of 200 Pa and a temperature of 900° to 1,200° C. In the growth of the $n^+$-SiC layer 140, $PH_3$ is mixed in the source gas to dope P (phosphorus). In growth of the p-SiC layer 150 and the $p^+$-SiC layer 160, $B_2H_6$ is mixed in the source gas to dope B, thereby growing the p-SiC layer 150 and the $p^+$-SiC layer 160 (FIG. 2A).

Figure 2B:
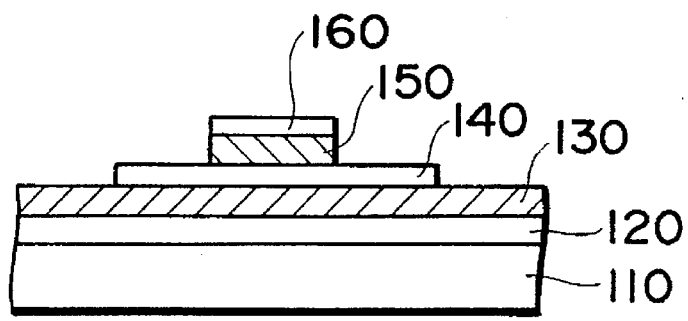
Figure 2C:
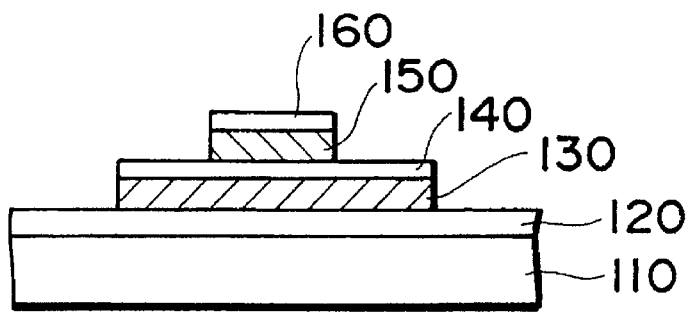
Figure 2D:
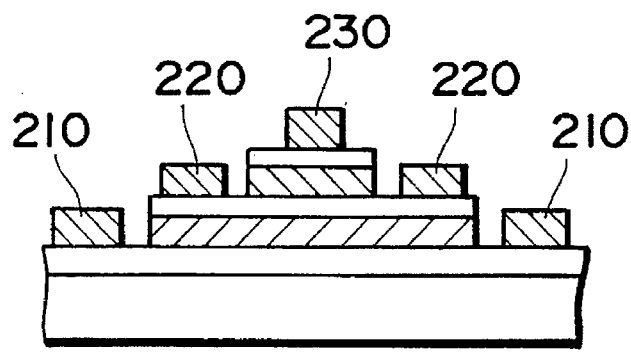

A mask is formed except for portions corresponding to the collector and base regions. The p-SiC layer 150, the $p^+$-SiC layer 160, and the $n^+$-SiC layer 140 are etched by RIE (Reactive Ion Etching) (FIG. 2B). At this time, a reaction gas is a gas mixture of $CF_4+O_2$ (5%). The $p^-$-diamond layer 130 is etched by RIBE (Reactive Ion Beam Etching) using a gas mixture of $Ar+N_2O$ (20%) and a resist on the $n^+$-SiC layer 140 as a mask (FIG. 2C). The AlSi emitter electrode 210, the TaSi base electrode 220, and the Mo/Au collector electrode 230 are formed and wired (FIG. 2D). In these steps, a sample was formed, and its characteristics were measured. A current gain of 1,200 and a collector breakdown voltage of 20 V were obtained. A good operation was performed even at a temperature of 300° C.

As described above, the collector and base form a heterojunction, and the base and emitter form a homojunction. Therefore, these layers can be formed with high precision.

Figure 3A:
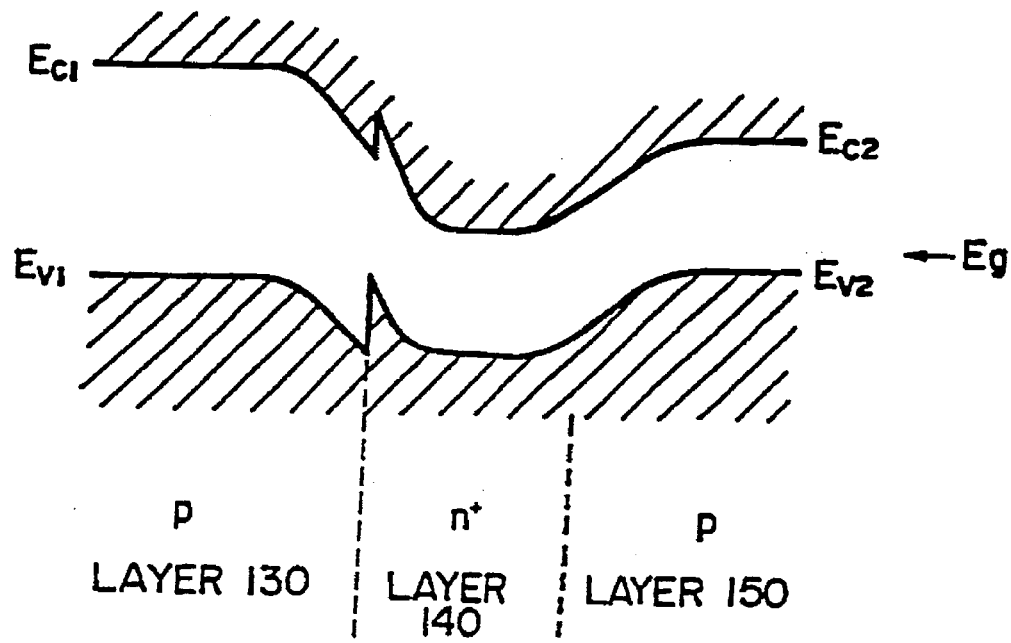
FIGS. 3A and 3B are band diagrams of the transistor shown in FIG. 1.

This transistor is a pnp transistor having a heterojunction formed by p-type diamond and n-type SiC. The $p^-$-diamond layer 130 having a low carrier concentration is formed together with the heterojunction between the emitter and base. The $p^-$-SiC layer 150 having a low carrier concentration is formed between the collector and base. This transistor is operated using holes as a majority carrier and is estimated to have a band diagram shown in FIG. 3A. The band gap of the emitter region is about 5.5 eV, the band gap of each of the base and collector regions is about 2.2 eV, and a band gap difference of about 3.3 eV is present between the emitter and base.

Figure 3B:
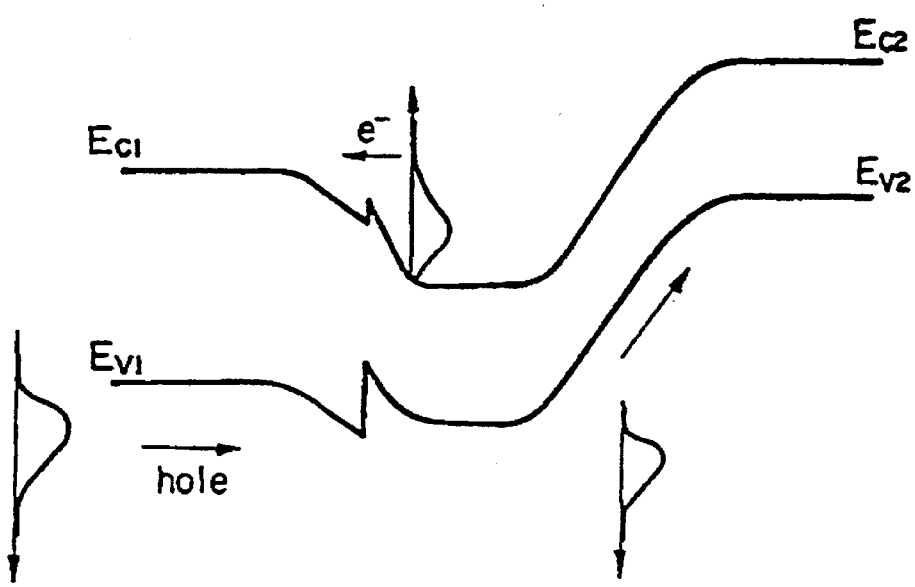

FIG. 3B is a band diagram showing a state wherein the transistor is DC-biased. Referring to FIG. 3B, electrons are distributed in a Fermi-Dirac distribution at a portion higher than the energy level of the lower end of the conduction band of the base region ($n^+$-SiC layer 140). The Fermi-Dirac distribution of holes is obtained at a portion higher than energy levels $E_{V1}$ and $E_{V2}$ of the upper end of the valence band. The holes have a higher energy in a downward direction. A DC bias operation will be described with reference to FIG. 3B.

The transistor is forward-biased such that the emitter has a positive voltage and the base has a negative voltage. The energy level of the base region is higher than that of the emitter region. When forward biasing is performed such that the collector has a negative voltage, the energy level of the collector region becomes high. Electrons as a minority carrier are injected from the base, but only a small number of electrons having an energy higher than the potential carrier of the emitter region flow to the emitter. On the other hand, the potential barrier of the valence band is lowered by the heterojunction, and the potential barrier is also lowered by the bias. For this reason, most of the holes flow in the collector region through the base region. Therefore, a large collector current flows with a small base current, thereby obtaining a large current amplification factor.

Since silicon carbide has a larger band gap than Si (Si: about 1.1 eV), the device can be properly operated even at high temperatures although the band gap of SiC is slightly narrowed at such high temperatures. In addition, the device can be operated even at a high collector voltage. This device is superior to a state-of-the-art transistor by properly selecting parameters such as a film thickness.

Since diamond having a high heat conductivity and a low dielectric constant is used as the material for the substrate, good heat dissipation properties can be obtained. In addition, the stray capacitance of a wiring layer can be reduced. These advantages are enhanced when the device is used with a high power at a high frequency. In particular, since the transistor shown in FIG. 1 has the emitter on the substrate side, the emitters of a plurality of transistors can be connected through the $p^+$-diamond layer 120 to advantageously arrange an ECL (Emitter Coupled Logic) serving as a high-speed logic.

The above-mentioned transistor may be manufactured to have a self-aligned structure, as known in a compound semiconductor (e.g., GaAs).

Figure 4:
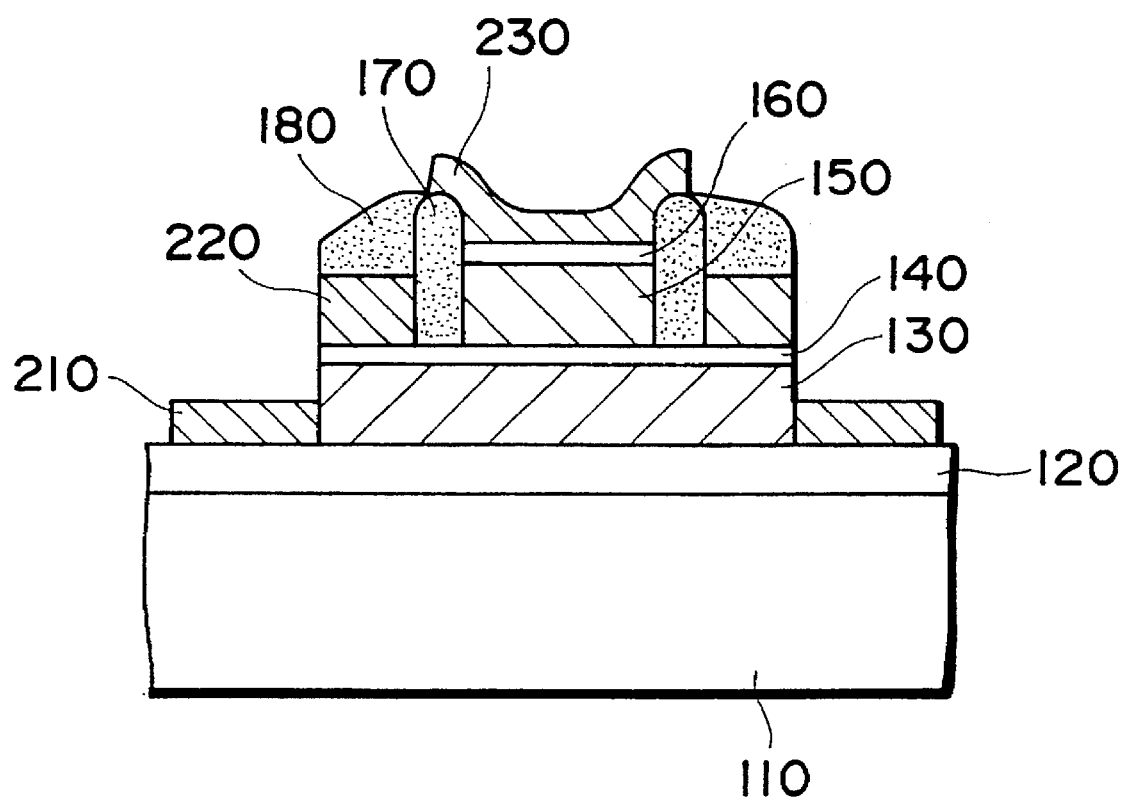
FIG. 4 is a sectional view showing a transistor identical to that of FIG. 1 and having a self-aligned structure.

A compound semiconductor is used to form an HBT manufactured by self-alignment using an insulating film on a side wall, as described in Hayama et al., "Fully Self-Aligned AlGaAs/GaAs HBT having AlGaAs Passivation Layer", the Institute of Electronics and Information, Technical Report ED-89-147 (1989), PP. 68–69. This structure is applied to the above-mentioned transistor, as shown in FIG. 4. FIGS. 5A to 5D show the steps in manufacturing the transistor shown in FIG. 4.

The transistor may have a structure in which a polyimide resin is used to form an insulating film, as described in Morizuka et al., "AlGaAs/Gas HBT's Fabricated by a Self-Alignment Technology Using Polyimide For Electrode Separation", IEEE Electron Device Letters, EDL-9, 598 (1988), or an integrated structure, as described in HAN-TZONG YUAN, et al., "The Development of Heterojunction Integrated Injection Logic", IEEE TRANSACTION ON ELECTRON DEVICE, Vol. 36, No. 10., October. Another example of such a transistor is described in K. Nagata et al., "Self-aligned AlGaAs/GaAs HBT with low emitter resistance utilizing InGaAs cap layer", IEEE Trans. Electron Devices, Vol. ED-35, PP. 2–7, 1988.

In the transistor shown in FIG. 4, the base electrode 220 is self-aligned by an $SiO_2$ protective film 170 formed on the side surfaces of the p-SiC layer 150 and the $p^+$-SiC layer 160. At the same time, the emitter region is etched and the emitter electrode 210 is formed, using an $SiO_2$ protective film 180 on the base electrode 220.

Figure 5A:
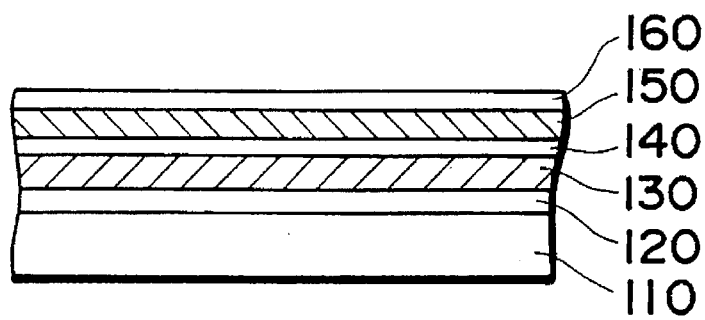
FIGS. 5A to 5D are sectional views for explaining the steps in manufacturing the transistor shown in FIG. 4.
Figure 5B:
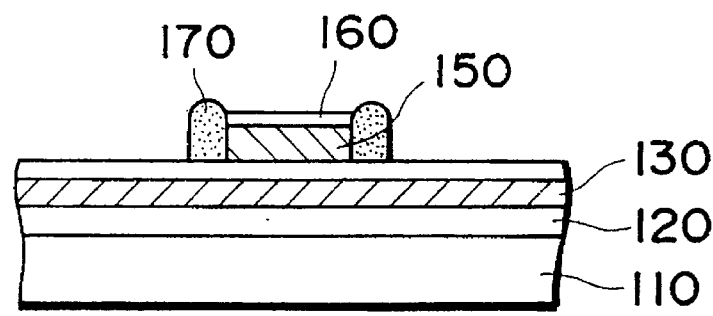
Figure 5C:
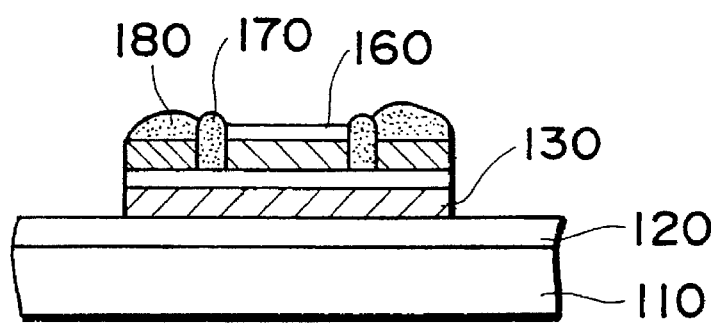
Figure 5D:
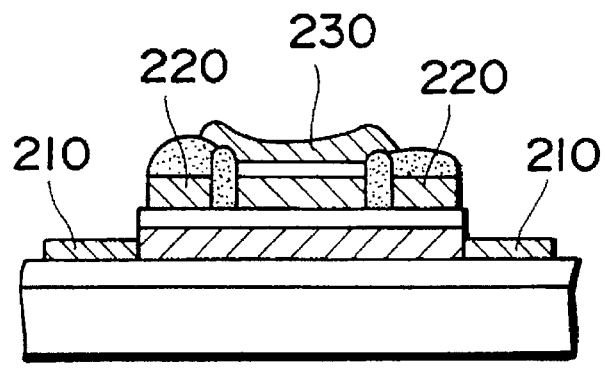

As in FIG. 2A, a $p^+$-diamond layer 120, a p-diamond layer 130, an $n^+$-SiC layer 140, a p-SiC layer 150, and a $p^+$-SiC layer 160 are sequentially formed on a nondoped diamond substrate 110 (FIG. 5A). Thereafter, the $p^-$-SiC layer 150 and the $p^+$-SiC layer 160 are eliminated using a mask formed except for a portion serving as a collector region, and a protective film 170 is formed (FIG. 5B). A base electrode 220 and an $SiO_2$ protective film 180 are formed, and the p-diamond layer 130 and the $n^+$-SiC layer 140 are etched using the base electrode 220 and the $SiO_2$ protective film 180 as masks (FIG. 5C). An emitter electrode 210 and a collector electrode 230 are then formed (FIG. 5D). The same etching conditions as in the above embodiment are used in this process, and the same mask material and insulating material as in the above references can be used.

Etching is performed using the protective films 170 and 180, and the like to form the electrodes. For this reason, the number of photomasks in the fabrication process can be small, and the photolithographic process including resist coating can be simplified. Error factors caused by mask alignment can be reduced, and a finer micropattern can be formed.

Various modifications of this embodiment can be made.

For example, SiC is exemplified to have a cubic crystal structure. However, SiC may have a hexagonal crystal structure (called 6H-SiC or α-Sic). 6H-SiC has a band gap of 2.86 eV (band gap difference: 1.54 eV), and a higher voltage than that required for 3C-SiC is required, but heat resistance and collector breakdown voltage can be improved.

Figure 6:
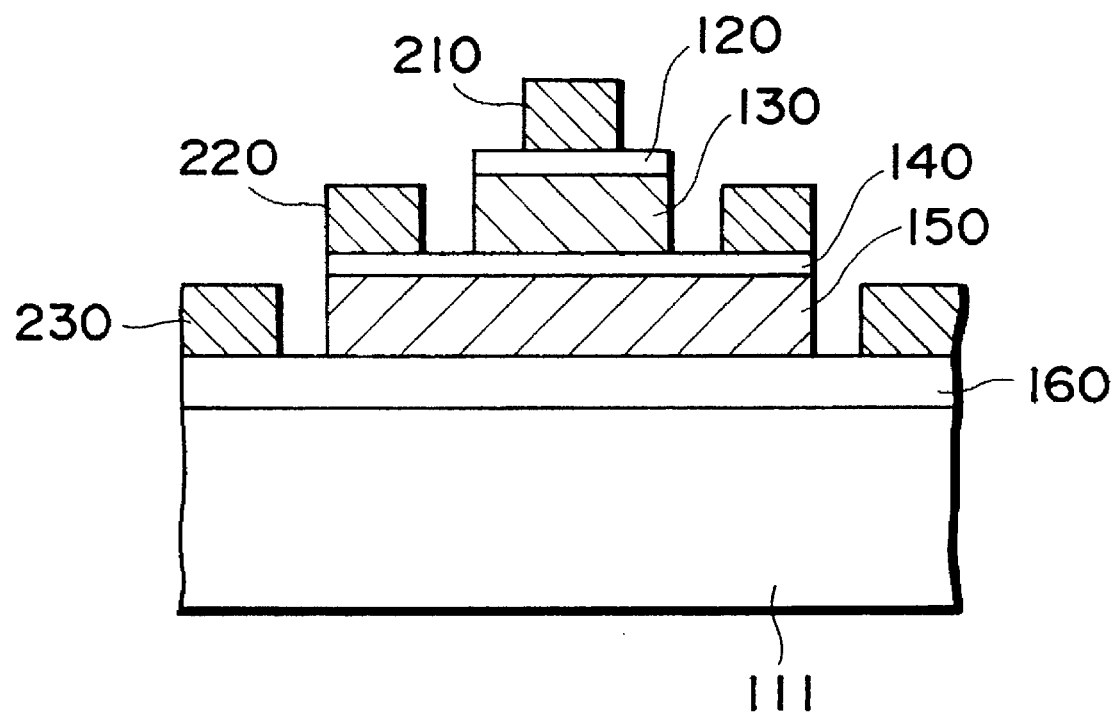
FIG. 6 is a sectional view showing the structure of the second embodiment.

Another embodiment of the present invention will be described with reference to the accompanying drawings. FIG. 6 shows the structure of a transistor according to the second embodiment. In this transistor, a $p^+$-SiC layer 160, a p-SiC layer 150, an $n^+$-SiC layer 140, a p-diamond layer 130, and a $p^+$-diamond layer 120 are sequentially formed on a nondoped SiC substrate 111. A collector electrode 230, a base electrode 220, and an emitter electrode 210 are formed on and electrically connected to the $p^+$-SiC layer 160, the $n^+$-SiC layer 140, and the $p^+$-diamond layer 120, respectively. SiC is defined herein to have a cubic crystal structure (called 3C-SiC or β-SiC).

This transistor is manufactured by the following steps.

Figure 7A:
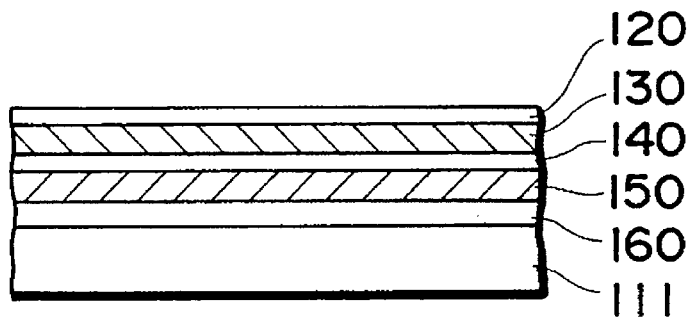
FIGS. 7A to 7D are sectional views for explaining the steps in manufacturing a transistor shown in FIG. 6.

The $p^+$-SiC layer 160, the p-SiC layer 150, and the $n^+$-SiC layer 140 are sequentially formed on the SiC substrate 111 by a low-pressure CVD method. At this time, a source gas was a gas mixture of $C_3H_8$/$SiHCl_2$ at a mixing ratio of 1:2, $H_2$ was used as a carrier gas, and the growth conditions were a pressure of 200 Pa and a temperature of 900° to 1,200° C. In the growth of the $n^+$-SiC layer 140, $PH_3$ is mixed in the source gas to dope P (phosphorus). In the growth of the p-SiC layer 150 and the $p^+$-SiC layer 160, $B_2H_6$ is mixed in the source gas to dope B (boron) to grow the p-SiC layer 150 and the $p^+$-SiC layer 160. Thereafter, the p-diamond layer 130 and the $p^+$-diamond layer 120 are sequentially formed by a microwave CVD method. At this time, the microwave had a frequency of 2.45 GHz and an output power of 400 W. A source gas was a gas mixture of $CH_4$/$H_2$ at a mixing ratio of 4:100, and the growth conditions were a pressure of 500 Torr and a temperature of 600° to 900° C. At this time, $B_2H_6$ is mixed in the source gas to dope B, and the content of B is changed to grow the $p^+$-diamond layer 120 and the p-diamond layer 130 (FIG. 7A).

Figure 7B:
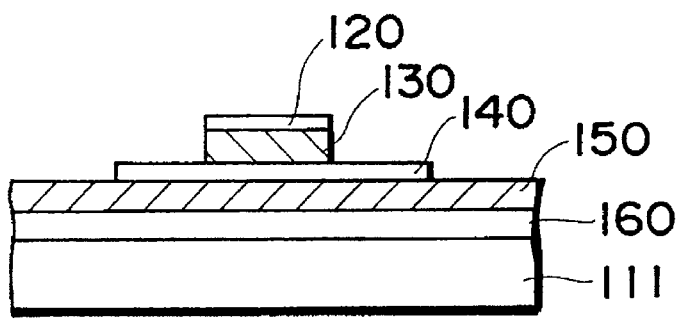
Figure 7C:
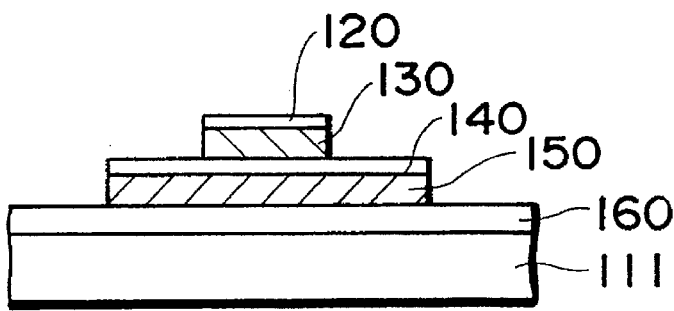
Figure 7D:
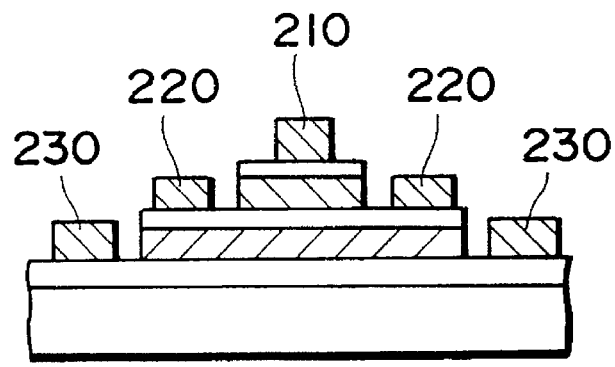

The resultant structure is masked except for portions serving as the emitter and base regions, and the diamond layers 120 and 130 are etched by RIBE (Reactive Ion Beam Etching) using a gas mixture of Ar+$N_2O$ (20%) (FIG. 7B). Thereafter, the p-SiC layer 150 and the $n^+$-SiC layer 140 are etched by RIE (Reactive Ion Etching) using a resist on the diamond layers 120 and 130 as a mask (FIG. 7C). At this time, the reaction gas is a gas mixture of $CF_4+O_2$ (5%). The AlSi emitter electrode 210, the TaSi base electrode 220, and the Mo/Au collector electrode 230 are formed and wired (FIG. 7D). A sample was formed by these steps, and the characteristics of the sample were measured. The sample had a current gain of 1,200 and a collector breakdown voltage of 20 V. The sample was properly operated even at a temperature of 300° C.

Figure 8A:
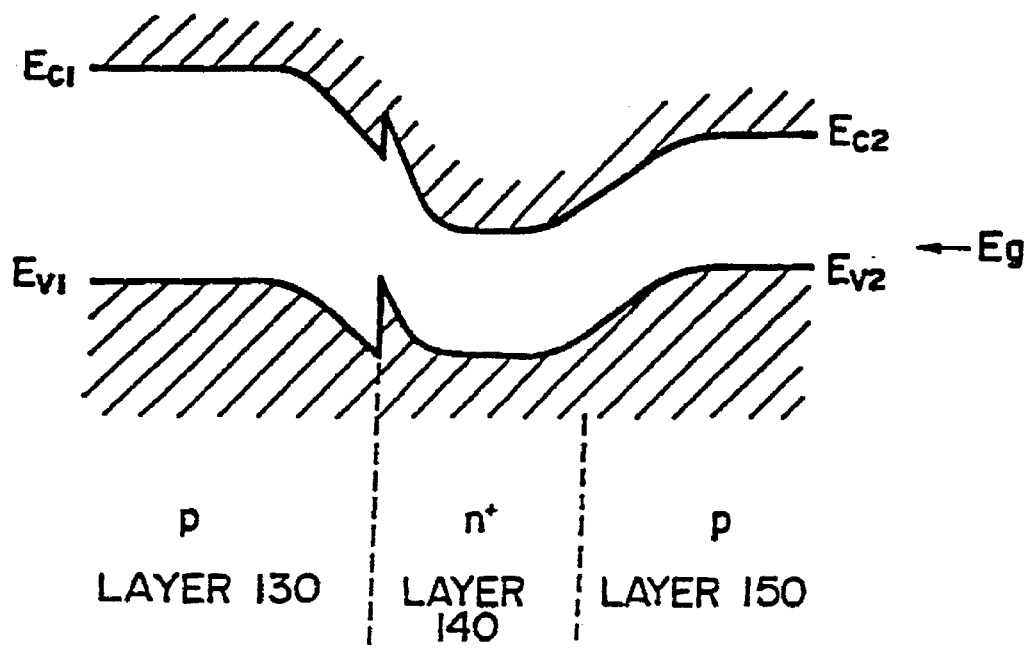
FIGS. 8A and 8B are band diagrams of the transistor shown in FIG. 6.

This transistor is a pnp transistor having a heterojunction formed by p-type diamond and n-type SiC. The p-diamond layer 130 having a low carrier concentration is formed together with the heterojunction between the emitter and base. The p-SiC layer 150 having a low carrier concentration is formed between the collector and base. This transistor is operated using holes as a majority carrier and is estimated to have a band diagram shown in FIG. 8A. The band gap of the emitter region is about 5.5 eV, the band gap of each of the base and collector regions is about 2.2 eV, and a band gap difference of about 3.3 eV is present between the emitter and base.

Figure 8B:
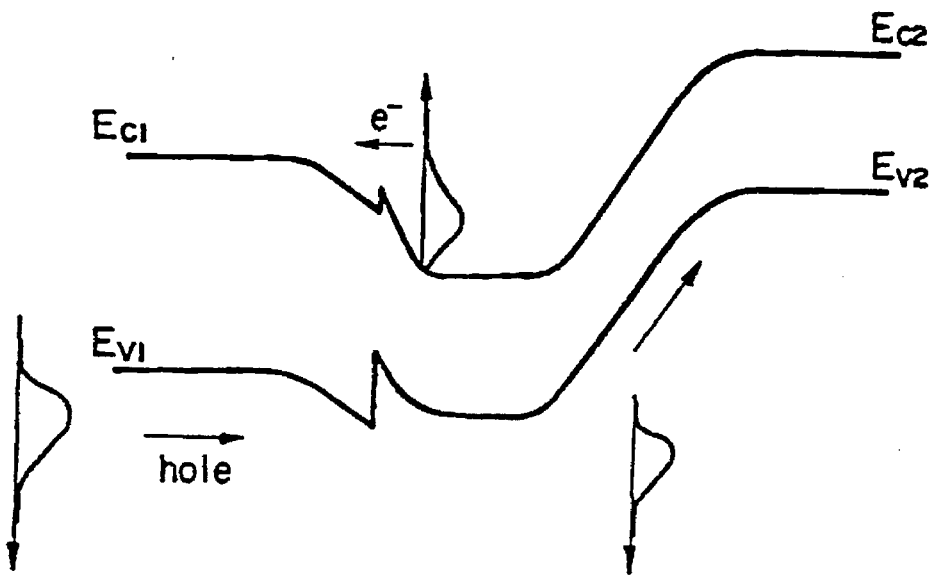

FIG. 8B is a band diagram showing a state wherein the transistor is DC-biased. Referring to FIG. 8B, electrons are distributed in a Fermi-Dirac distribution at a portion higher than the energy level of the lower end of the conduction band of the base region ($n^+$-SiC layer 140). The Fermi-Dirac distribution of holes is obtained at a portion higher than energy levels $E_{V1}$ and $E_{V2}$ of the upper end of the valence band. The holes have a higher energy in a downward direction. A DC biased operation will be described with reference to FIG. 8B.

The transistor is forward-biased such that the emitter has a positive voltage and the base has a negative voltage. The energy level of the base region is higher than that of the emitter region. When forward biasing is performed such that the collector has a negative voltage, the energy level of the collector region becomes high. Electrons as a minority carrier are injected from the base, but only a small number of electrons having an energy higher than the potential carrier of the emitter region flow to the emitter. On the other hand, the potential barrier of the valence band is lowered by the heterojunction, and the potential barrier is also lowered by the bias. For this reason, most of the holes flow in the collector region through the base region. Therefore, a large collector current flows with a small base current, thereby obtaining a large current amplification factor. A band gap difference between SiC and Si of the conventional structure is 1.1 eV, and a larger current amplification factor than that of the conventional structure can be obtained.

Since silicon carbide has a larger band gap than Si (Si: about 1.1 eV), the device can be properly operated even at high temperatures although the band gap of SiC is slightly narrowed at such high temperatures. In addition, the device can be operated even at a high collector voltage. This device is superior to a state-of-the-art transistor by properly selecting parameters such as a film thickness.

Since SiC having a high heat conductivity and a low dielectric constant is used as the material for the substrate, good heat dissipation properties can be obtained. In addition, the stray capacitance of a wiring layer can be reduced. These advantages are enhanced when the device is used with a high power at a high frequency. In addition, since the SiC layers 160, 150, and 140 are made of the same material, they can be properly formed. A homojunction between the base and collector is also an advantage of this transistor.

Since the p-diamond layer 130 and the $p^+$-diamond layer 120 are formed as the uppermost layers, these layers are finally formed in the fabrication process. For this reason, in the formation of these layers, a diamond layer having a size (1 to 10 $\mu m^\square$) corresponding to the emitter size, can be selectively grown. For this reason, the diamond layer need not be formed to have a large size, and the manufacturing problems can be reduced.

The diamond layers 130 and 120 are preferably formed by monocrystalline diamond, but may be formed by polycrystalline diamond. In the latter case, although the current injection efficiency and the current amplification factor are reduced, fabrication can be properly performed. A polycrystalline diamond layer having a relatively uniform orientation, i.e., 95% or more of the (110) planes was formed as a sample layer, following the same procedures as in the above embodiment. A transistor having a current gain of 250 was obtained with this diamond layer.

Figure 9:
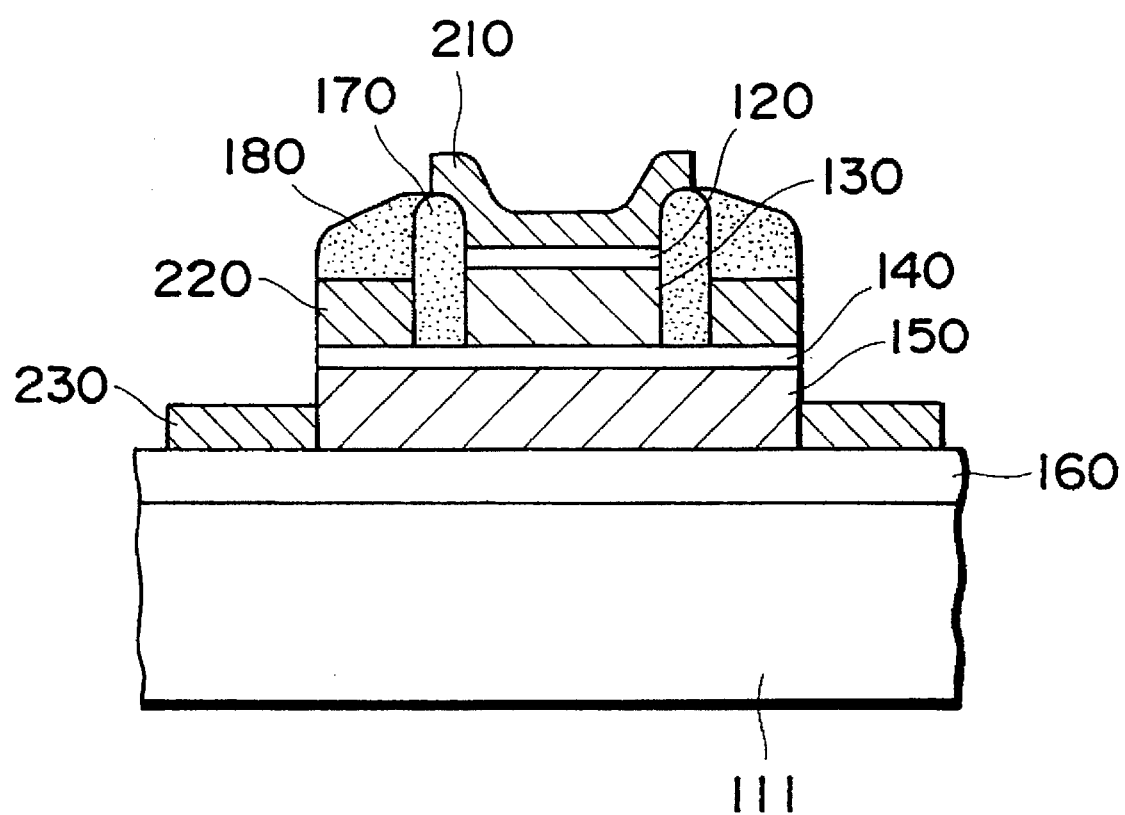
FIG. 9 is a sectional view showing a transistor identical to that of FIG. 6 and having a self-aligned structure.

FIG. 9 shows the self-aligned structure of the transistor in FIG. 6.

In this transistor, a base electrode 220 is self-aligned by an $SiO_2$. protective film 170 formed on the side wall of the diamond layers 130 and 120. At the same time, an $SiO_2$ protective film 180 on the base electrode 220 is used to etch the collector region and form the collector electrode 230. FIGS. 10A to 10D show the steps in manufacturing this transistor. These steps are performed under the same etching conditions as in the previous embodiment, and any other structure is the same as that in FIG. 4.

Figure 10A:
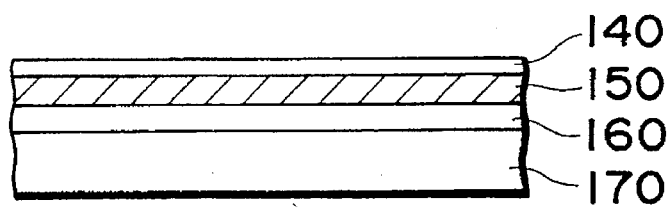
FIGS. 10A to 10D are sectional views for explaining the steps in manufacturing the transistor shown in FIG. 6.
Figure 10B:
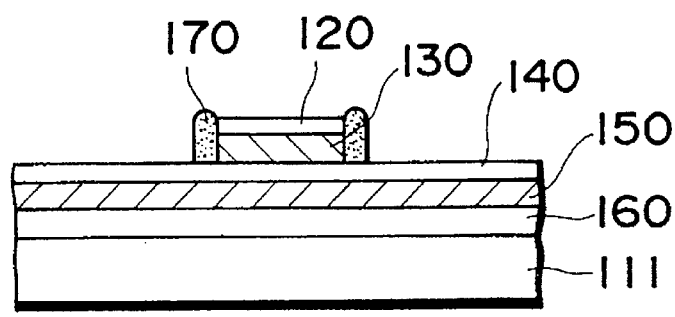
Figure 10C:
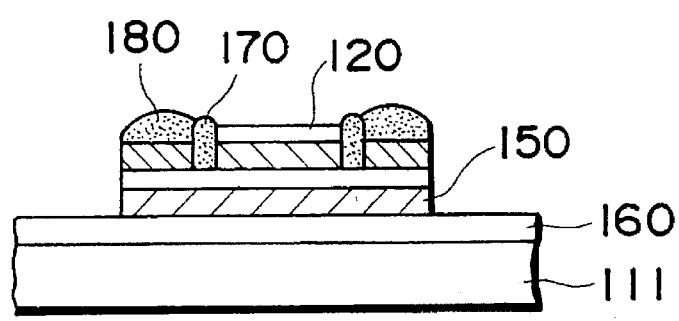
Figure 10D:
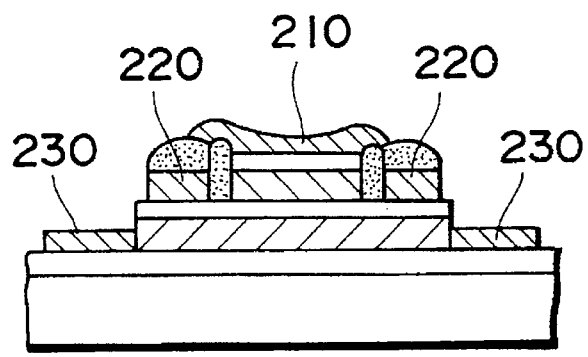

The $p^+$-SiC layer 160, the p-SiC layer 150, and the $n^+$-SiC layer 140 are sequentially formed on the SiC substrate 111 following the same procedures as in FIG. 7A (FIG. 10A). The resultant structure is masked except for a portion serving as an emitter region, and the p-diamond layer 130 and the $p^+$-diamond layer 120 are formed by the selective growth described above, thereby forming the protective film 170 (FIG. 10B). The base electrode 220 and the $SiO_2$ protective film 180 are formed, and the $n^+$-SiC layer 140, the p-SiC layer 150, and the $p^+$-SiC layer 160 are etched using the base electrode 220 and the $SiO_2$ protective film 180 as masks (FIG. 10C). The emitter electrode 210 and the collector electrode 230 are formed (FIG. 10D). The epitaxial growth is facilitated and the product yield can be increased as compared with a case wherein epitaxial growth is performed on the entire surface. According to this fabrication method, a transistor having a diamond layer having a size of 2 $\mu m^\square$ had a very high current amplification factor, i.e., a current gain of 900.

Since the protective films 170 and 180 and the like are used as etching masks to form the electrodes, the number of masks in the fabrication process can be reduced, and the photolithographic process such as resist coating can be simplified. Error factors caused by mask alignment can be reduced, and a finer micropattern can be formed.

Various modifications of this embodiment can be made.

For example, SiC is exemplified to have a cubic crystal structure. However, SiC may have a hexagonal crystal structure (called 6H-SiC or α-Sic). 6H-SiC has a band gap of 2.86 eV (band gap difference: 1.54 eV), and a higher voltage than that required for 3C-SiC is required, but heat resistance and collector breakdown can be improved.

Figure 11:
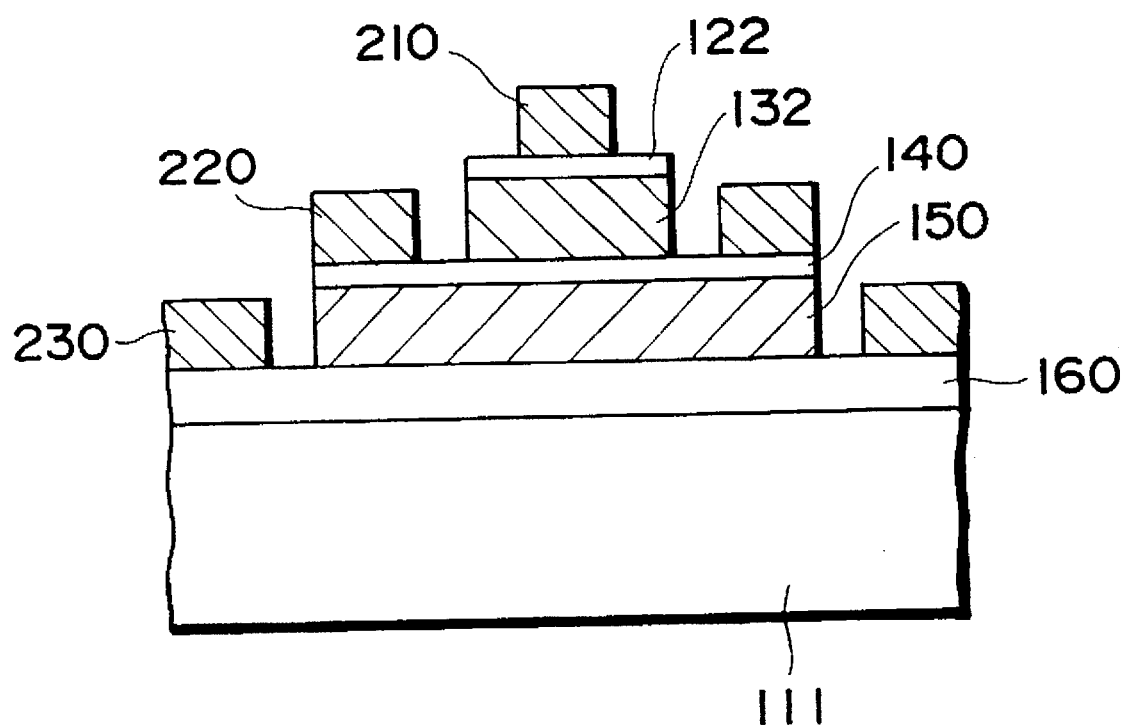
FIG. 11 is a sectional view showing the structure of the third embodiment.

The third embodiment of the present invention will be described with reference to the accompanying drawings. FIG. 11 shows the structure of a transistor according to the third embodiment. In this transistor, an $p^+$-SiC layer 160, a p-SiC layer 150, an $n^+$-SiC layer 140, a p-$BP_xN_{1-x}$ layer 132, and a p$^+$-BP$_x$N$_{1-x}$ layer 122 are sequentially formed on a nondoped SiC substrate 111. A collector electrode 230, a base electrode 220, and an emitter electrode 210 are formed on and electrically connected to the p$^+$-SiC layer 160, the n$^+$-SiC layer 140, and the p$^+$-BP$_x$N$_{1-x}$ layer 122, respectively. "x" in BP$_x$N$_{1-x}$ is set to 0.1 so that the lattice constant of BP$_x$N$_{1-x}$ becomes equal to that of SiC. Since these lattice constants are equal to each other, a fabrication advantage (i.e., the layers 132 and 122 can be properly formed) can be obtained as compared with the fabrication of the transistor shown in FIG. 6. SiC is defined herein to have a cubic crystal structure (3C-SiC or β-SiC).

This transistor is manufactured by the following steps.

Figure 12A:
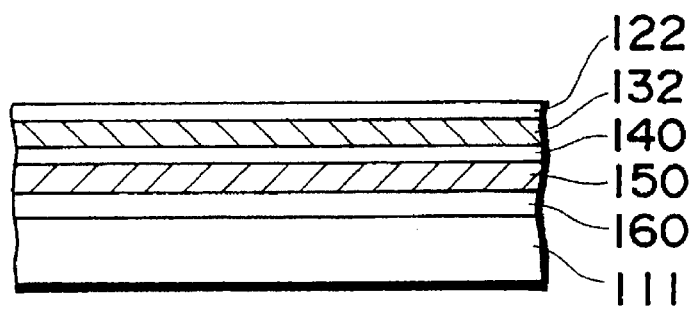
FIGS. 12A to 12D are sectional views for explaining the steps in manufacturing a transistor shown in FIG. 11.

The p$^+$-SiC layer 160, the p-SiC layer 150, and the n$^+$-SiC layer 140 are sequentially formed on the SiC substrate 111 by a low-pressure CVD method. At this time, a source gas was a gas mixture of C$_3$H$_8$/SiHCl$_2$ at a mixing ratio of 1:2, H$_2$ was used as a carrier gas, and the growth conditions were a pressure of 200 Pa and a temperature of 900° to 1,200° C. In the growth of the n$^+$-SiC layer 140, PH$_3$ is mixed in the source gas to dope P (phosphorus). In the growth of the p-SiC layer 150 and the p$^+$-SiC layer 160, B$_2$H$_6$ is mixed in the source gas to dope B (boron) to grow the p-SiC layer 150 and the p$^+$-SiC layer 160. Thereafter, the p-BP$_x$N$_{1-x}$ layer 132 and the p$^+$-BP$_x$N$_{1-x}$ layer 122 are sequentially formed by a thermal CVD method. At this time, a source gas was a gas mixture of B$_2$H$_6$ (e.g., 5%), PH$_3$ (e.g., 5%), NH$_3$, and H$_2$. The layers were grown at a temperature of 800° to 1,100° C. At this time, Zn is used as a p-type dopant, Zn(CH$_3$)$_3$ is mixed in the source gas, and the content of Zn(CH$_3$)$_3$ is changed to grow the p$^+$-BP$_x$N$_{1-x}$ layer 122 and the p-BP$_x$N$_{1-x}$ layer 132 (FIG. 12A). To obtain n-type BP$_x$N$_{1-x}$ layers, for example, Si is used as a p-type dopant, and SiH$_4$ is mixed in the source gas.

Figure 12B:
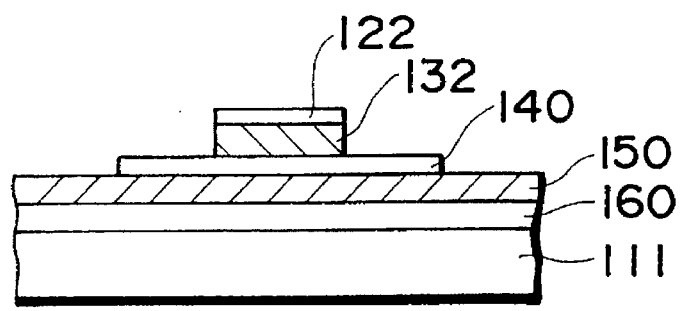
Figure 12C:
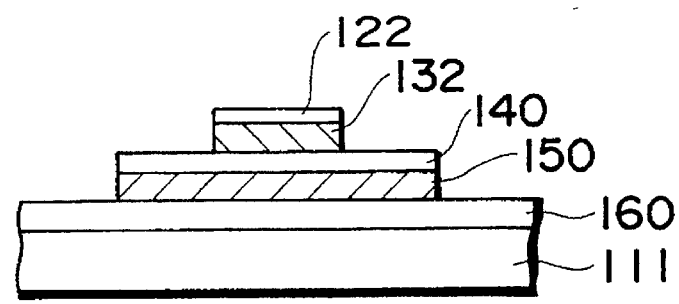
Figure 12D:
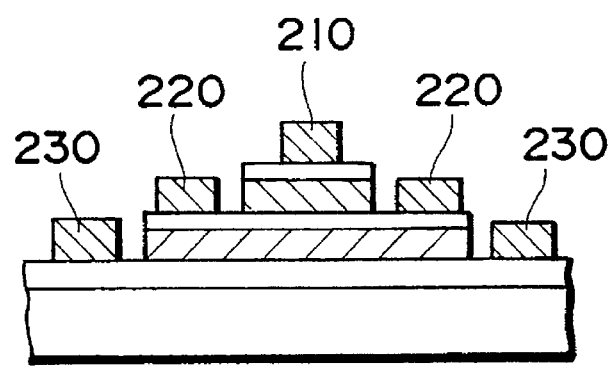

The resultant structure is masked except for portions serving as the emitter and base regions, and the BP$_x$N$_{1-x}$ layers 122 and 132 are etched by RIBE (Reactive Ion Beam Etching) using a gas mixture of Ar+N$_2$O (20%) (FIG. 12B). Thereafter, the p-SiC layer 150 and the n$^+$-SiC layer 140 are etched by RIE (Reactive Ion Etching) using a resist on the BP$_x$N$_{1-x}$ layers 122 and 132 as a mask (FIG. 12C). At this time, the reaction gas is a gas mixture of CF$_4$+O$_2$ (5%). The AlSi emitter electrode 210, the TaSi base electrode 220, and the Mo/Au collector electrode 230 are formed and wired (FIG. 12D).

Figure 13A:
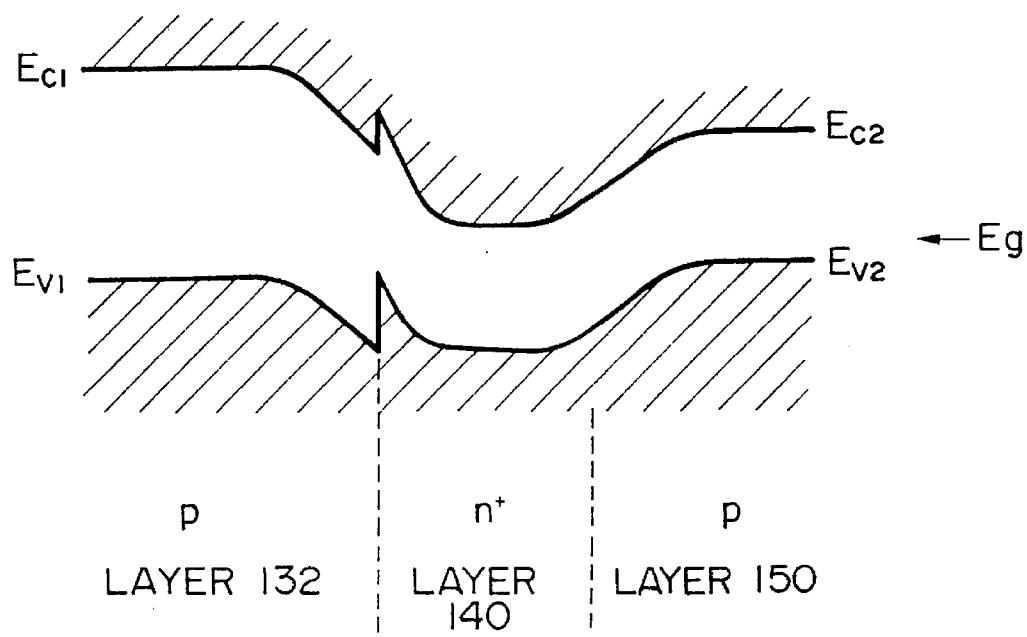
FIGS. 13A and 13B are band diagrams of the transistor shown in FIG. 11.

This transistor is a pnp transistor having a heterojunction formed by p-type BP$_x$N$_{1-x}$ and n-type SiC. The same advantage as in FIG. 6 is obtained except that the emitter consists of BP$_x$N$_{1-x}$. The p-BP$_x$N$_{1-x}$ layer 132 having a low carrier concentration is formed together with the heterojunction between the emitter and base. The p-SiC layer 150 having a low carrier concentration is formed between the collector and base. This transistor is operated using holes as a majority carrier and is estimated to have a band diagram shown in FIG. 13A. The band gap of the emitter region is about 3.0 eV, the band gap of each of the base and collector regions is about 2.2 eV, and a band gap difference of about 0.8 eV is present between the emitter and base.

Figure 13B:
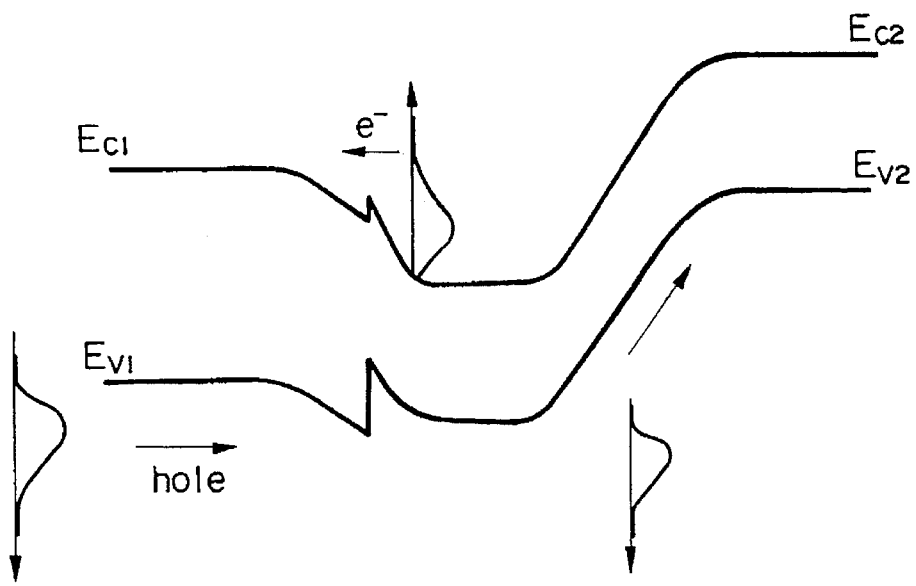

FIG. 13B is a band diagram showing a state wherein the transistor is DC-biased. Referring to FIG. 13B, electrons are distributed in a Fermi-Dirac distribution at a portion higher than the energy level of the lower end of the conduction band of the base region (n$^+$-SiC layer 140). The Fermi-Dirac distribution of holes is obtained at a portion higher than energy levels E$_{V1}$ and E$_{V2}$ of the upper end of the valence band. The holes have a higher energy in a downward direction. A DC bias operation will be described with reference to FIG. 13B.

The transistor is forward-biased such that the emitter has a positive voltage and the base has a negative voltage. The energy level of the base region is higher than that of the emitter region. When forward biasing is performed such that the collector has a negative voltage, the energy level of the collector region becomes high. Electrons as a minority carrier are injected from the base, but only a small number of electrons having an energy higher than the potential carrier of the emitter region flow to the emitter. On the other hand, the potential barrier of the valence band is lowered by the heterojunction, and the potential barrier is also lowered by the bias. For this reason, most of the holes flow in the collector region through the base region. Therefore, a large collector current flows with a small base current, thereby obtaining a large current gain.

Since the emitter, base, and collector regions have large band gaps, the transistor of this embodiment can be properly operated even at high temperatures although the band gaps are slightly narrowed at such high temperatures. In addition, the device can be operated even at a high collector voltage. This transistor of this embodiment is superior to a state-of-the-art transistor by properly selecting parameters such as a film thickness. In addition, since SiC having a high heat conductivity and a low dielectric constant is used as the material for the substrate, good heat dissipation properties can be obtained. These advantages are enhanced when the device is used with a high power at a high frequency.

Figure 14:
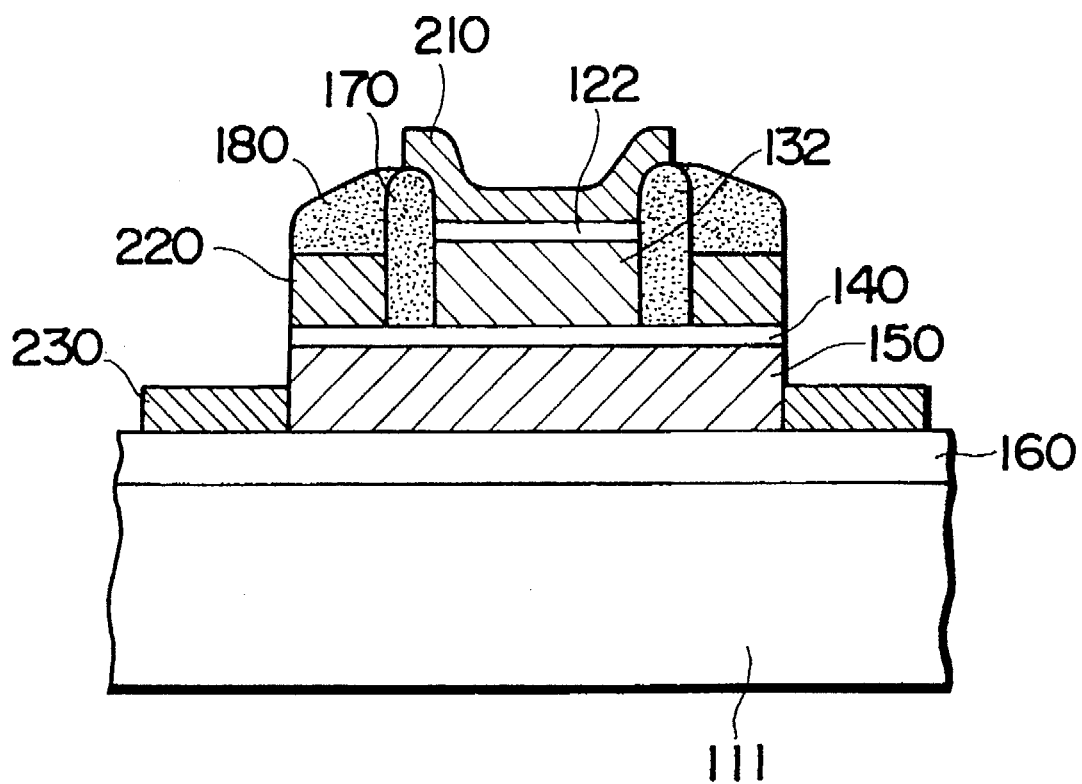
FIG. 14 is a sectional view showing a transistor identical to that of FIG. 11 and having a self-aligned structure.

FIG. 14 shows the self-aligned structure of the transistor described above.

In this transistor, the base electrode 220 is self-aligned by an SiO$_2$ protective film 170 formed on the side wall of the BP$_x$N$_{1-x}$ layers 132 and 122. At the same time, an SiO$_2$ protective film 180 on the base electrode 220 is used to etch the collector region and form the collector electrode 230. FIGS. 15A to 15D show the steps in manufacturing this transistor. The etching conditions are the same as those in the previous embodiment, and any other arrangement is the same as in FIG. 4.

Figure 15A:
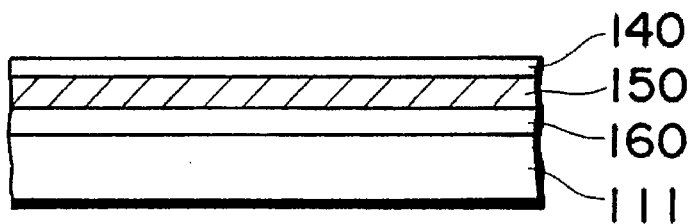
FIGS. 15A to 15D are sectional views for explaining the steps in manufacturing the transistor shown in FIG. 14.
Figure 15B:
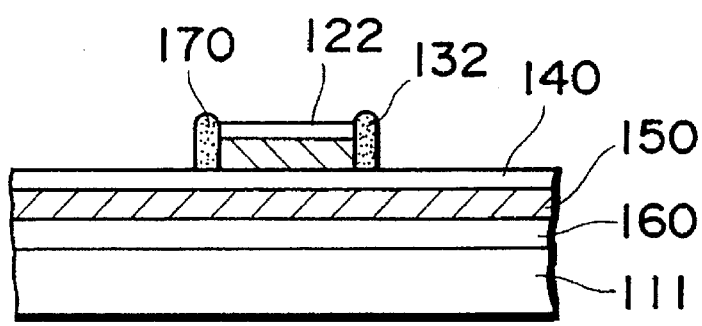
Figure 15C:
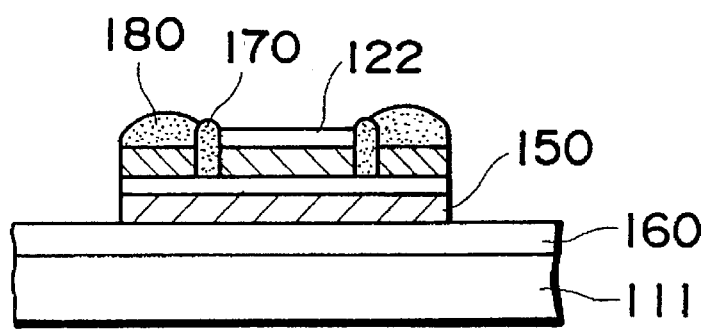
Figure 15D:
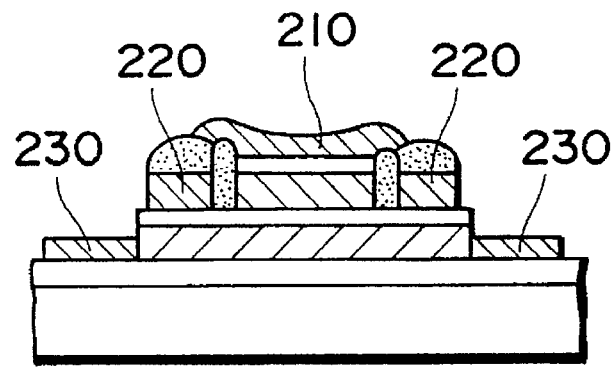

The p$^+$-SiC layer 160, the p-SiC layer 150, and the n$^+$-SiC layer 140 are sequentially formed on the SiC substrate 111 following the same procedures as in FIG. 12A (FIG. 15A). The resultant structure is masked except for a portion serving as an emitter region, and the p-BP$_x$N$_{1-x}$ layer 132 and the p$^+$-BP$_x$N$_{1-x}$ layer 122 are formed by the selective growth described above, thereby forming the protective film 170 (FIG. 15B). The base electrode 220 and the SiO$_2$ protective film 180 are formed, and the n$^+$-SiC layer 140, the p-SiC layer 150, and the p$^+$-SiC layer 160 are etched using the base electrode 220 and the SiO$_2$ protective film 180 as masks (FIG. 15C). The emitter electrode 210 and the collector electrode 230 are formed (FIG. 15D). Epitaxial growth is facilitated and the product yield can be increased as compared with a case wherein epitaxial growth is performed on the entire surface.

Since the protective films 170 and 180 and the like are used as etching masks to form the electrodes, the number of masks in the fabrication process can be reduced, and the photolithographic process such as resist coating can be simplified. Error factors caused by mask alignment can be reduced, and a finer micropattern can be formed.

Various modifications of this embodiment can be made.

For example, SiC is exemplified to have a cubic crystal structure. However, SiC may have a hexagonal crystal structure (called 6H-SiC or α-Sic). 6H-SiC has a band gap of 2.86 eV, and a higher voltage than that required for 3C-SiC is required, but heat resistance and collector breakdown can be improved. In addition, a pnp transistor is exemplified, but the type of dopant is changed to obtain an npn transistor. Furthermore, the value of x in $BP_xN_{1-x}$ is changed to change the band gap.

Figure 16:
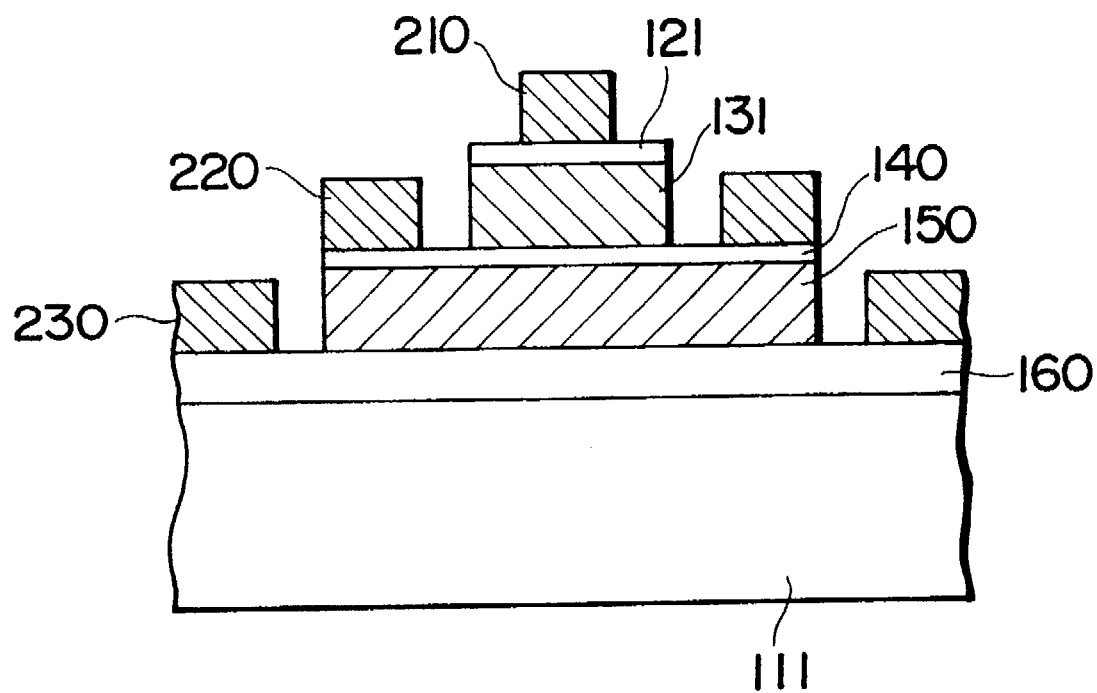
FIG. 16 is a sectional view showing the structure of the fourth embodiment.

The fourth embodiment of the present invention will be described with reference to the accompanying drawings. FIG. 16 shows the structure of a transistor formed on a cubic SiC (called 3C-SiC or β-SiC) substrate. In this transistor, a $p^+$-SiC layer 160 having a cubic crystal structure, a p-SiC layer 150 having a cubic crystal structure, an $n^+$-SiC layer 140 having a cubic crystal structure, a p-SiC layer 131 having a hexagonal crystal structure (called 6H-SiC or α-SiC), and a $p^+$-SiC layer 121 having a hexagonal crystal structure are sequentially formed on a nondoped SiC substrate 111. A collector electrode 230, a base electrode 220, and an emitter electrode 210 are formed on and electrically connected to the $p^+$-SiC layer 160, the $n^+$-SiC layer 140, and the $p^+$-SiC layer 121, respectively. In order to distinguish the cubic crystal from the hexagonal crystal, cubic SiC is represented as 3CSiC, and hexagonal SiC is represented by 6HSiC.

This transistor is manufactured by the following steps.

Figure 17A:
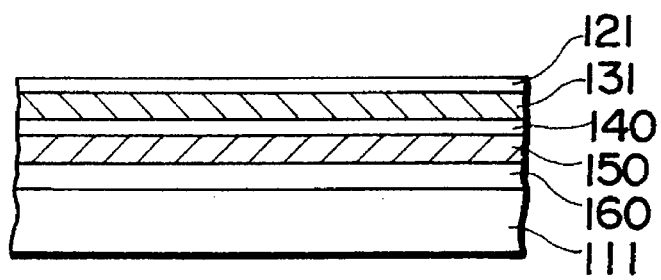
FIGS. 17A to 17D are sectional views for explaining the steps in manufacturing a transistor shown in FIG. 16.

The $p^+$-3CSiC layer 160, the p-3CSiC layer 150, and the $n^+$-3CSiC layer 140 are sequentially formed on the 3CSiC substrate 111 by a low-pressure CVD method. At this time, a source gas was a gas mixture of $C_3H_8/SiHCl_2$ at a mixing ratio of 1:2, $H_2$ was used as a carrier gas, and the growth conditions were a pressure of 200 Pa and a temperature of 900° to 1,200° C. In the growth of the $n^+$-3CSiC layer 140, $PH_3$ is mixed in the source gas to dope P (phosphorus). In the growth of the p-3CSiC layer 150 and the $p^+$-3CSiC layer 160, $B_2H_6$ is mixed in the source gas to dope B (boron) to grow the p-3CSiC layer 150 and the $p^+$-3CSiC layer 160. Thereafter, the p-6HSiC layer 131 and the $p^+$-6HSiC layer 121 are sequentially formed by a thermal CVD method. At this time, the p-6HSiC layer 131 and the $p^+$-6HSiC layer 121 are formed in the same manner as in the $p^+$-3CSiC layer 160 and the p-3CSiC layer 150 (FIG. 17A).

Figure 17B:
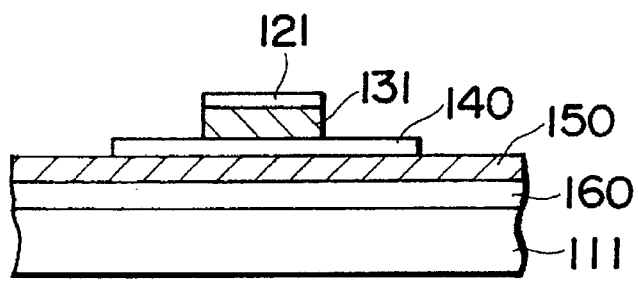
Figure 17C:
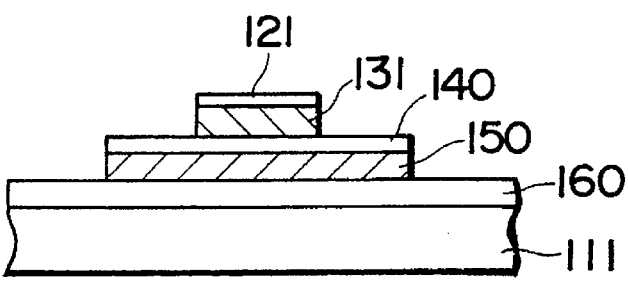
Figure 17D:
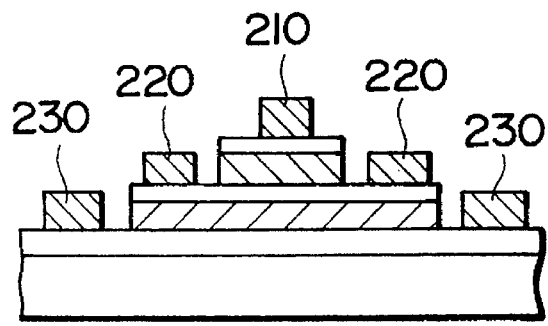

The resultant structure is masked except for portions serving as the emitter and base regions, and the 6HSiC layers 121 and 131 are etched by RIBE (Reactive Ion Beam Etching) using a gas mixture of $Ar+N_2O$ (20%) (FIG. 17B). Thereafter, the p-3CSiC layer 150 and the $n^+$-3CSiC layer 140 are etched by RIE (Reactive Ion Etching) using a resist on the 6HSiC layers 121 and 131 as a mask (FIG. 17C). At this time, the reaction gas is a gas mixture of $CF_4+O_2$ (5%). The AlSi emitter electrode 210, the TaSi base electrode 220, and the Mo/Au collector electrode 230 are formed and wired (FIG. 17D).

Figure 18A:
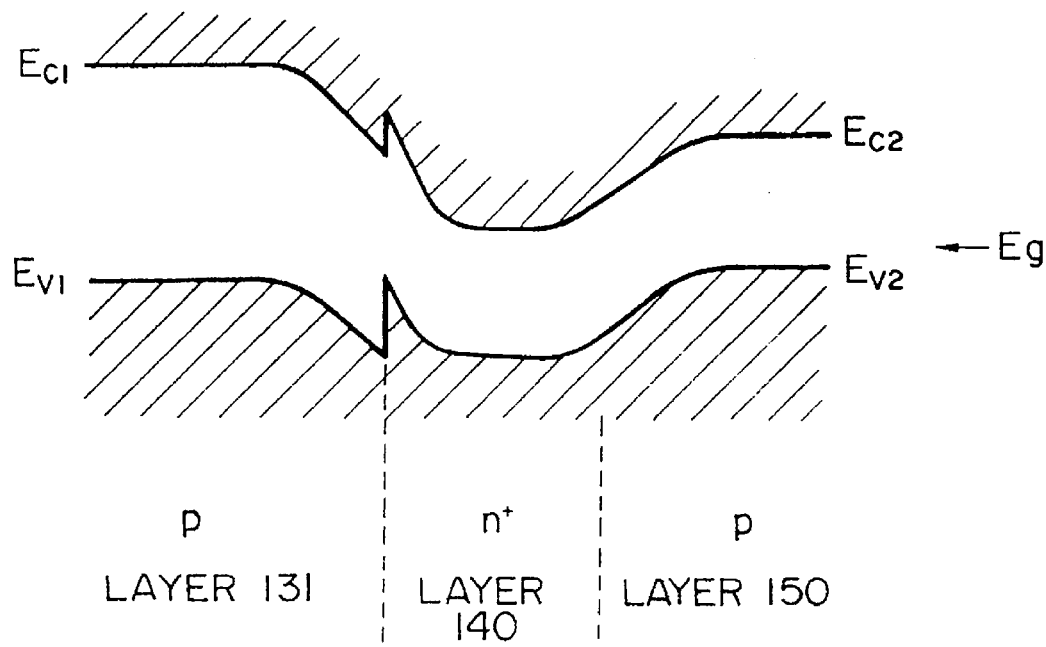
FIGS. 18A and 18B are band diagrams of the transistor shown in FIG. 16.

This transistor is a pnp transistor having a heterojunction formed by p-type 6HSiC and n-type 3CSiC. The p-6HSiC layer 131 having a low carrier concentration is formed together with the heterojunction between the emitter and base. The $p^-$-3CSiC layer 150 having a low carrier concentration is formed between the collector and base. This transistor is operated using holes as a majority carrier and is estimated to have a band diagram shown in FIG. 18A. The band gap of the emitter region is about 2.88 eV, the band gap of each of the base and collector regions is about 2.2 eV, and a band gap difference of about 0.66 eV is present between the emitter and base.

Figure 18B:
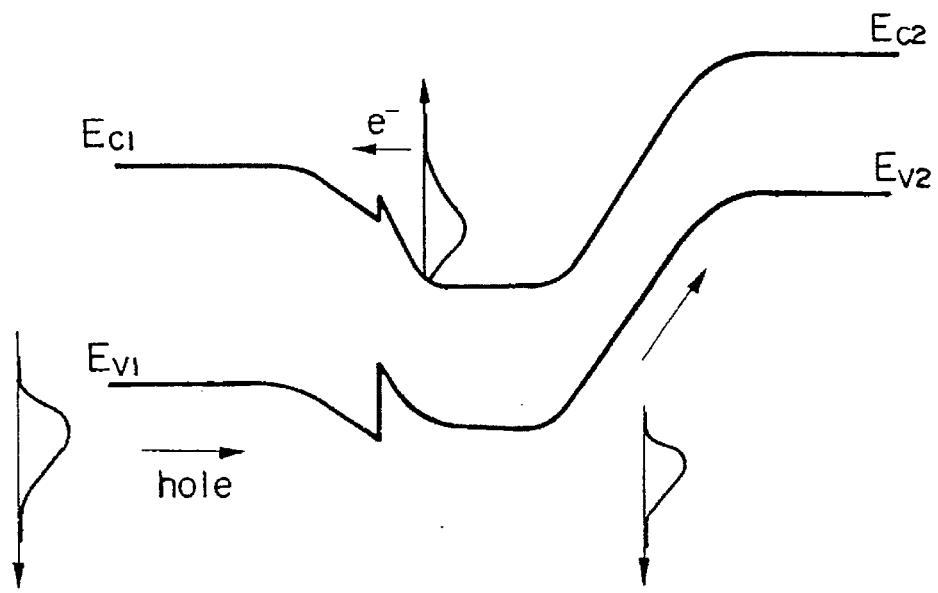

FIG. 18B is a band diagram showing a state wherein the transistor is DC-biased. Referring to FIG. 18B, electrons are distributed in a Fermi-Dirac distribution at a portion higher than the energy level of the lower end of the conduction band of the base region ($n^+$-3CSiC layer 140). The Fermi-Dirac distribution of holes is obtained at a portion higher than energy levels $E_{V1}$ and $E_{V2}$ of the upper end of the valence band. The holes have a higher energy in a downward direction. A DC biased operation will be described with reference to FIG. 18B.

The transistor is forward-biased such that the emitter has a positive voltage and the base has a negative voltage. The energy level of the base region is higher than that of the emitter region. When forward biasing is performed such that the collector has a negative voltage, the energy level of the collector region becomes high. Electrons as a minority carrier are injected from the base, but only a small number of electrons having an energy higher than the potential carrier of the emitter region flow to the emitter. On the other hand, the potential barrier of the valence band is lowered by the heterojunction, and the potential barrier is also lowered by the bias. For this reason, most of the holes flow in the collector region through the base region. Therefore, a large collector current flows with a small base current, thereby obtaining a large current amplification factor. Since the emitter, base, and collector regions have large band gaps, the transistor of this embodiment can be properly operated even at high temperatures although the band gaps are slightly narrowed at such high temperatures. In addition, the device can be operated even at a high collector voltage. This transistor of this embodiment is superior to a state-of-the-art transistor by properly selecting parameters such as a film thickness. In addition, since 3CSiC having a high heat conductivity and a low dielectric constant is used as the material for the substrate, good heat dissipation properties can be obtained. These advantages are enhanced when the device is used with a high power at a high frequency. In addition, a large substrate can be used to advantageously facilitate mass production.

In particular, this transistor has a heterojunction using a single material as SiC. For this reason, as compared with other heterojunction transistors, extra materials are not required, and the fabrication process can be facilitated. In addition, an npn transistor can be manufactured in addition to the pnp transistor, and the composition of the dopant can be controlled. Therefore, transistors having different impurity profiles can be formed. Transistors having various characteristics can be provided in a variety of applications.

Figure 19:
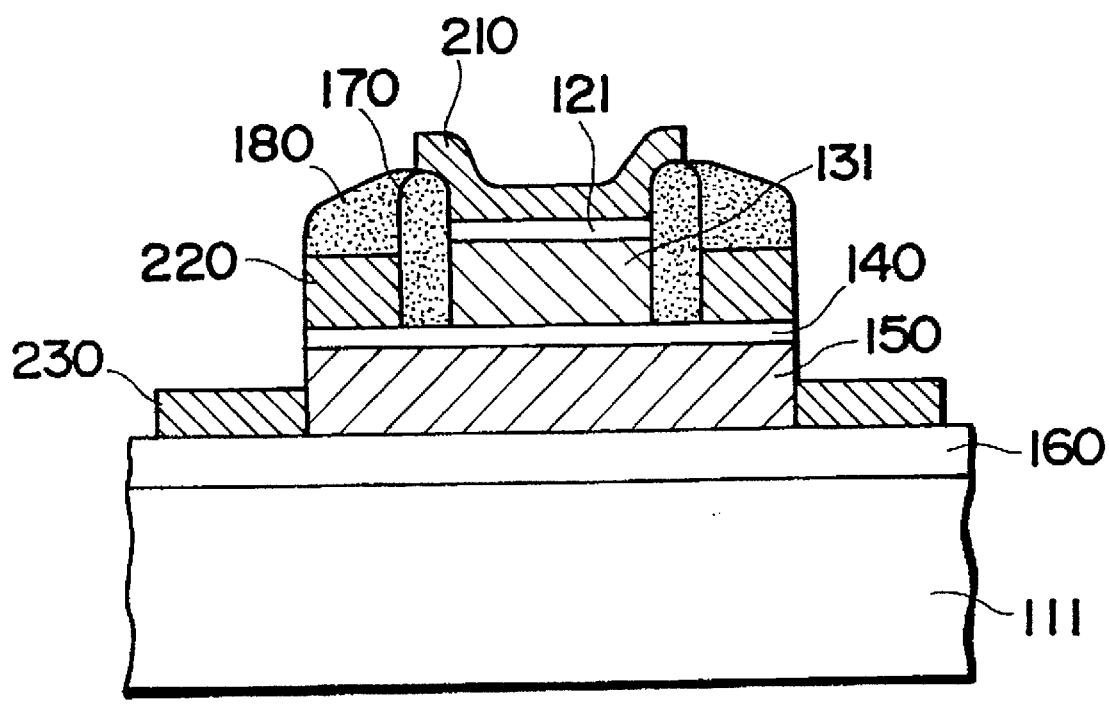
FIG. 19 is a sectional view showing a transistor identical to that of FIG. 16 and having a self-aligned structure.

FIG. 19 shows the self-aligned structure of the transistor in FIG. 16.

In this transistor, the base electrode 220 is self-aligned by an $SiO_2$ protective film 170 formed on the side wall of the 6HSiC layers 131 and 121. At the same time, an $SiO_2$ protective film 180 on the base electrode 220 is used to etch the collector region and form the collector electrode 230. FIGS. 20A to 20D show the steps in manufacturing this transistor. These steps are performed under the same etching conditions as in the previous embodiment, and any other structure is the same as that in FIG. 4.

Figure 20A:
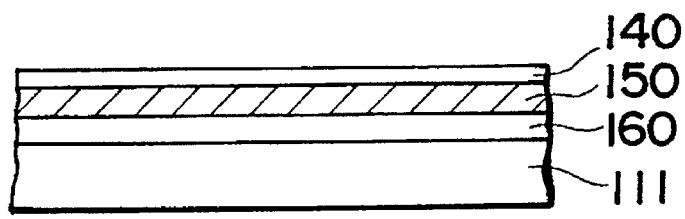
FIGS. 20A to 20D are sectional views for explaining the steps in manufacturing the transistor shown in FIG. 19.
Figure 20B:
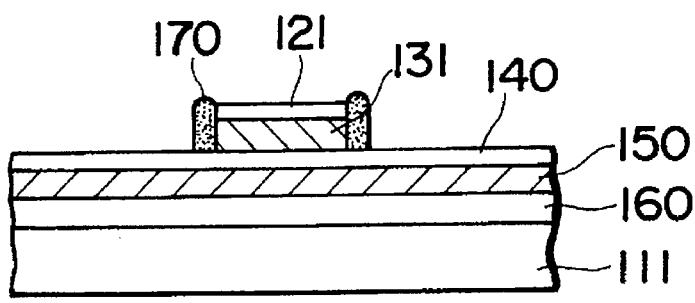
Figure 20C:
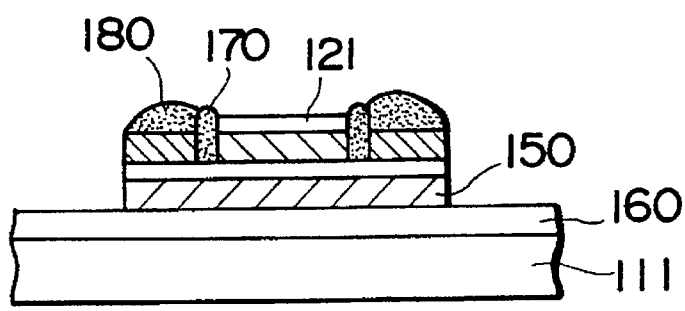
Figure 20D:
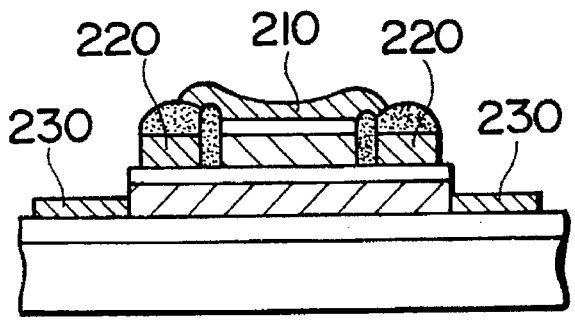

The $p^+$-3CSiC layer 160, the p-3CSiC layer 150, and the $n^+$-3CSiC layer 140 are sequentially formed on the 3CSiC substrate 111 following the same procedures as in FIG. 17A (FIG. 20A). The resultant structure is masked except for a portion serving as an emitter region, and the p-6HSiC layer 131 and the $p^+$-6HSiC layer 121 are formed by the selective growth described above, thereby forming the protective film 170 (FIG. 20B). The base electrode 220 and the $SiO_2$ protective film 180 are formed, and the $n^+$-3CSiC layer 140, the p-3CSiC layer 150, and the $p^+$-3CSiC layer 160 are etched using the base electrode 220 and the SiO$_2$ protective film 180 as masks (FIG. 20C). The emitter electrode 210 and the collector electrode 230 are formed (FIG. 20D). Since the protective films 170 and 180 and the like are used as etching masks to form the electrodes, the number of masks in the fabrication process can be reduced, and the photolithographic process such as resist coating can be simplified. Error factors caused by mask alignment can be reduced, and a finer micropattern can be formed.

Various modifications of this embodiment can be made.

For example, the SiC substrate is exemplified to have a cubic crystal structure. However, the SiC substrate may have a hexagonal crystal structure. In this case, the emitter region (6HSiC layers 121 and 131), the base region (3CSiC layer 140), and the collector region (3CSiC layers 150 and 160) are formed in the order named. The emitter region serves as a lower layer to facilitate wiring in an ECL (Emitter Coupled Logic).

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a semiconductor device, comprising the steps of:

forming a first semiconductor layer on a diamond substrate, said first semiconductor layer being fabricated from a first material containing carbon as a main component and having a predetermined first majority carrier, first semiconductor layer and said diamond substrate having a first crystal structure;

forming a second semiconductor layer on said first semiconductor layer, said second semiconductor layer being fabricated from a second material containing silicon carbide as a main component and having a second majority carrier, said second semiconductor layer having a polarity opposite to that of said first semiconductor layer;

forming a third semiconductor layer on said second semiconductor layer, said third semiconductor being fabricated from a third material containing silicon carbide as a main component and having a third majority carrier, said third semiconductor layer having the same polarity as that of said first semiconductor layer; and forming an emitter electrode connected to said first semiconductor layer, a base electrode connected to said second semiconductor layer, and a collector electrode connected to said third semiconductor layer.

2. A method according to claim 1, wherein said step of forming said emitter base and collector electrodes comprises the steps of:

removing said first, second, and third semiconductor layers except for prospective portions of said first, second and third semiconductor layers corresponding to said emitter electrode, said base electrode, and said collector electrode, respectively;

forming an insulating film on side walls of at least one of said prospective portions of said first, second, and third semiconductor layers; and forming said base and collector electrodes in a self-aligned manner using said insulating film and at least one of said prospective portions of said first, second, and third semiconductor layers.

3. A method of manufacturing a semiconductor device, comprising the steps of:

forming a first semiconductor layer on a silicon carbide, said first semiconductor layer being fabricated from a first material containing silicon carbide as a main component and having a predetermined first majority carrier;

forming a second semiconductor layer on said first semiconductor layer, said second semiconductor layer being fabricated from a second material containing silicon carbide as a main component and having a second majority carrier, said second semiconductor layer having a polarity opposite to that of said first semiconductor layer;

forming a third semiconductor layer on said second semiconductor layer, said third semiconductor layer having said first majority carrier and essentially consisting of a third material having a larger band nap than that of said second semiconductor layer, said third material essentially consisting of PB$_x$N$_{1-x}$ (wherein $0 \leq x \leq 1$); and forming a collector electrode connected to said first semiconductor layer, a base electrode connected to said second semiconductor layer, and an emitter electrode connected to said third semiconductor layer.

4. A method of manufacturing a semiconductor device, comprising the steps of:

forming a first semiconductor layer on a silicon carbide, said first semiconductor layer being fabricated from a first material containing silicon carbide as a main component and having a predetermined first majority carrier;

forming a second semiconductor layer on said first semiconductor layer, said second semiconductor layer being fabricated from a second material containing silicon carbide as a main component and having a second majority carrier, said second semiconductor layer having a polarity opposite to that of said first semiconductor layer;

forming a third semiconductor layer on said second semiconductor layer, said third semiconductor layer having said first majority carrier and essentially consisting of a third material having a larger band gap than that of said second semiconductor layer; and forming a collector electrode connected to said first semiconductor layer, a base electrode connected to said second semiconductor layer, and an emitter electrode connected to said third semiconductor layer, wherein said first and second materials essentially consists of cubic silicon carbide, and said third material essentially consists of hexagonal silicon carbide.

5. A method according to claim 3, wherein said third semiconductor layer is formed by a selective growth process.

6. A method of manufacturing a semiconductor device, comprising the steps of:

forming a first semiconductor layer on a silicon carbide, said first semiconductor layer being fabricated from a first material containing silicon carbide as a main component and having a predetermined first majority carrier;

forming a second semiconductor layer on said first semiconductor layer, said second semiconductor layer being fabricated from a second material containing silicon carbide as a main component and having a second majority carrier, said second semiconductor layer having a polarity opposite to that of said first semiconductor layer;

forming a third semiconductor layer on said second semiconductor layer, said third semiconductor layer having said first majority carrier and essentially consisting of a third material having a larger band gap than that of said second semiconductor layer; and forming a collector electrode connected to said first semiconductor layer, a base electrode connected to said second semiconductor layer, and an emitter electrode connected to said third semiconductor layer, wherein said step of forming said emitter, base and collector electrodes comprises the steps of:

removing said first, second, and third semiconductor layers except for prospective portions of said first, second and third semiconductor layers corresponding to said emitter electrode, said base electrode, and said collector electrode, respectively;

forming an insulating film on side walls of at least one of said prospective portions of said first, second, and third semiconductor layers; and forming said base and collector electrodes in a self-aligned manner using said insulating film and at least one of said prospective portions of said first, second, and third semiconductor layers.

7. A method according to claim 4, wherein said third semiconductor layer is formed by a selective growth process.

8. A method according to claim 6, wherein said third semiconductor layer is formed by a selective growth process.

* * * * *